United States Patent
Lim et al.

(10) Patent No.: US 10,726,764 B2
(45) Date of Patent: Jul. 28, 2020

(54) SHIFT REGISTER AND DISPLAY DEVICE COMPRISING THE SAME

(71) Applicant: LG DISPLAY CO., LTD., Seoul (KR)

(72) Inventors: YuSok Lim, Seoul (KR); Sohyun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/193,808

(22) Filed: Nov. 16, 2018

(65) Prior Publication Data

US 2019/0156730 A1 May 23, 2019

(30) Foreign Application Priority Data

Nov. 17, 2017 (KR) .................. 10-2017-0153866

(51) Int. Cl.
*G09G 3/20* (2006.01)
*G09G 3/3266* (2016.01)
(Continued)

(52) U.S. Cl.
CPC ............ *G09G 3/2092* (2013.01); *G09G 3/20* (2013.01); *G09G 3/3266* (2013.01); *G09G 3/3677* (2013.01); *G11C 19/28* (2013.01); *G09G 3/3275* (2013.01); *G09G 3/3688* (2013.01); *G09G 2310/0267* (2013.01);
(Continued)

(58) Field of Classification Search
None
See application file for complete search history.

(56) References Cited

U.S. PATENT DOCUMENTS 10,490,133 B2 * 11/2019 Lin ................. G09G 3/3266
2011/0142191 A1 6/2011 Tobita et al.
(Continued)

FOREIGN PATENT DOCUMENTS

KR 10-2014-0096613 A 8/2014
WO WO 2017/117849 A1 7/2017

*Primary Examiner* — Duane N Taylor, Jr.
(74) *Attorney, Agent, or Firm* — Birch, Stewart, Kolasch & Birch, LLP

(57) ABSTRACT

A bi-directional shift register can include a plurality of stages, an $N^{th}$ stage among the plurality of stages including a first switching unit configured to receive a forward driving signal and a reverse driving signal, and control a Q-node; a second switching unit configured to receive an $(N+2)^{th}$ clock signal, and control a QB-node; a third switching unit configured to discharge the QB-node to a low-level voltage when the Q-node is charged to a high-level voltage, and discharge the Q-node to the low-level voltage when the QB-node is charged to the high-level voltage; and an output unit configured to output an $N^{th}$ clock signal to an output terminal based on a voltage at the Q-node, in which the forward driving signal is an output signal from an $(N-1)^{th}$ stage or a forward start signal from an external source external to the shift register, and the reverse driving signal is an output signal from the $(N+1)^{th}$ stage or a reverse start signal from the external source.

10 Claims, 9 Drawing Sheets

(51) Int. Cl.
*G09G 3/36* (2006.01)
*G11C 19/28* (2006.01)
*G09G 3/3275* (2016.01)

(52) U.S. Cl.
CPC ............... *G09G 2310/0283* (2013.01); *G09G 2310/0286* (2013.01); *G09G 2310/0289* (2013.01); *G09G 2310/08* (2013.01); *G09G 2330/08* (2013.01)

(56) References Cited

U.S. PATENT DOCUMENTS

| | | |
|---|---|---|
| 2013/0083885 A1 | 4/2013 | Lee et al. |
| 2013/0169319 A1 | 7/2013 | Sasaki et al. |
| 2017/0102805 A1 | 4/2017 | Xiao et al. |
| 2017/0116925 A1 | 4/2017 | Lee et al. |
| 2017/0124975 A1 | 5/2017 | Xiao et al. |
| 2018/0046308 A1 | 2/2018 | Xiao et al. |

\* cited by examiner

SHIFT REGISTER AND DISPLAY DEVICE COMPRISING THE SAME

CROSS-REFERENCE TO RELATED APPLICATIONS

This application claims the priority benefit of Korean Patent Application No. 10-2017-0153866 filed on Nov. 17, 2017, in the Korean Intellectual Property Office, the disclosure of which is incorporated herein by reference into the present application.

BACKGROUND

Technical Field

The present disclosure relates to a shift register and a display device including the shift register, and more particularly, to a shift register which can be driven in both forward and reverse directions and a display device including the shift register.

Description of the Related Art

As the information technology evolves, the market for display devices as media providing users with information is growing. Electronic devices such as mobile phones, tablets, navigation devices, laptop computers, televisions, monitors and public displays (PDs) include a display device, and accordingly, the demand for display devices is ever increasing. Such a display device includes a plurality of pixels for displaying an image and drivers for controlling the pixels so that each of the pixels transmits or emits light.

A driver unit of a display device includes a data driver for applying data signals to data lines of the array of pixels, a gate driver (or a scan driver) for applying gate signals (or scan signals) synchronized with the data signals sequentially to gate lines (scan lines) of the array of pixels, and a timing controller for controlling the data driver and the gate driver.

The gate driver includes a shift register for generating a gate signal. The shift register includes a plurality of stages which are connected to each other in a dependent manner. Each of the stages generates an output in response to a driving signal and moves the output to the next stage in accordance with a shift signal. Thus, the gate driver sequentially drives the plurality of stages in the shift register to generate the gate signal.

SUMMARY

The inventors of the application have found a problem in a plurality of stages driven sequentially in a forward direction that the stages cannot be driven from the last stage to the first stage even by applying a driving signal to the last stage for driving the stages in the reverse direction.

In an existing shift register, a driving signal is applied to the top stage so that the shift register is driven from the top stage to the bottom stage sequentially. In other words, the shift register is designed to be driven only in one direction. Therefore, when a shift register in a display panel is placed in reverse during the process of assembling the display panel with the display device, the shift register cannot operate in the reverse direction.

Accordingly, the inventors of the application have devised a shift register having a novel structure that allows a plurality of stages to be driven not only in a direction from the top stage to the bottom stage, but also in a direction from the bottom stage to the top stage, e.g., a bidirectional shift register, and a display device including the shift register.

In this regard, the inventors of the application have recognized a problem that a bidirectional shift register uses more transistors disposed therein than a shift register driven only in one direction. As the number of transistors disposed in a shift register increases, the area occupied by the shift register increases, which can increase the area of the non-active area. In particular, in a high-resolution display device, the number of pixels increases and the number of gate lines (or scan lines) also increases, and thus the problem of an increase in the area of the shift register can become more serious.

In view of the above, the inventors of the application have devised a shift register having a novel structure in which a single stage outputs a plurality of output signals to thereby reduce the number of stages of the shift register and to reduce the area occupied by the shift register.

In addition, the inventors of the application have also devised a shift register having a novel structure that uses a minimum number of transistors to allow the shift register to operate in a forward direction as well as a reverse direction, so that the area occupied by the shift register can be reduced.

In view of the above, an object of the present disclosure is to provide a shift register that can be driven bi-directionally, and a display device including the same.

Another object of the present disclosure is to provide a shift register that can be driven bi-directionally with a minimum number of transistors to be added so that the area occupied by the shift register can be reduced, and a display device including the same.

Yet another object of the present disclosure is to provide a shift register in which a single stage outputs a plurality of output signals so that the number of stages is reduced, and a display device including the same It should be noted that objects of the present disclosure are not limited to the above-described objects, and other objects of the present disclosure will be apparent to those skilled in the art from the following descriptions.

According to an aspect of the present disclosure, there is provided a shift register including a plurality of stages. An $N^{th}$ stage among the plurality of stages includes a first switching unit for receiving a forward driving signal or a reverse driving signal, and controlling a Q-node; a second switching unit for receiving an $(N+2)^{th}$ clock signal, and controlling a QB-node; a third switching unit for discharging the QB-node to a low-level voltage if the Q-node is charged to a high-level voltage, and for discharging the Q-node to the low-level voltage if the QB-node is charged to the high-level voltage; and an output unit for outputting an $N^{th}$ clock signal to an output terminal based on a voltage at the Q-node. Accordingly, the shift register can be driven in two directions.

According to another aspect of the present disclosure, there is provided a shift register including a plurality of stages. An $N^{th}$ stage among the plurality of stages includes a first switching unit for receiving a forward driving signal or a reverse driving signal, and controlling a Q-node; a second switching unit for receiving an $(N+3)^{th}$ clock signal, and controlling a QB-node; a third switching unit for discharging the QB-node to a low-level voltage if the Q-node is charged to a high-level voltage, and for discharging the Q-node to the low-level voltage if the QB-node is charged to the high-level voltage; a first output unit for outputting an $N^{th}$ clock signal to a first output terminal based on a voltage at the Q-node; and a second output unit for outputting an $(N+1)^{th}$ clock signal to a second output terminal based on the voltage at the Q-node. Accordingly, the shift register can be driven in two directions, while the area of the shift register can be reduced.

A display device according to an example embodiment of the present disclosure can include a shift register according to any one of a variety of example embodiments of the present disclosure. Therefore, the display device can include the shift register that can be driven in both directions, and the area of the non-active area can be reduced.

The details of one or more embodiments of the subject matter described in this specification are set forth in the accompanying drawings and the description below.

According to an example embodiment of the present disclosure, a single stage of a shift register can receive an output signal from a previous or subsequent stage or a forward start signal or a reverse start signal and can be driven in a forward direction or a reverse direction based on the received signal.

In addition, according to an example embodiment of the present disclosure, a single stage of a shift register can output a plurality of output signals to reduce the number of stages included in the shift register and reduce the area of the shift register.

Further, according to an example embodiment of the present disclosure, a bidirectional shift register can be implemented with a minimum number of transistors to be added, so that the area of the non-active area can be reduced.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
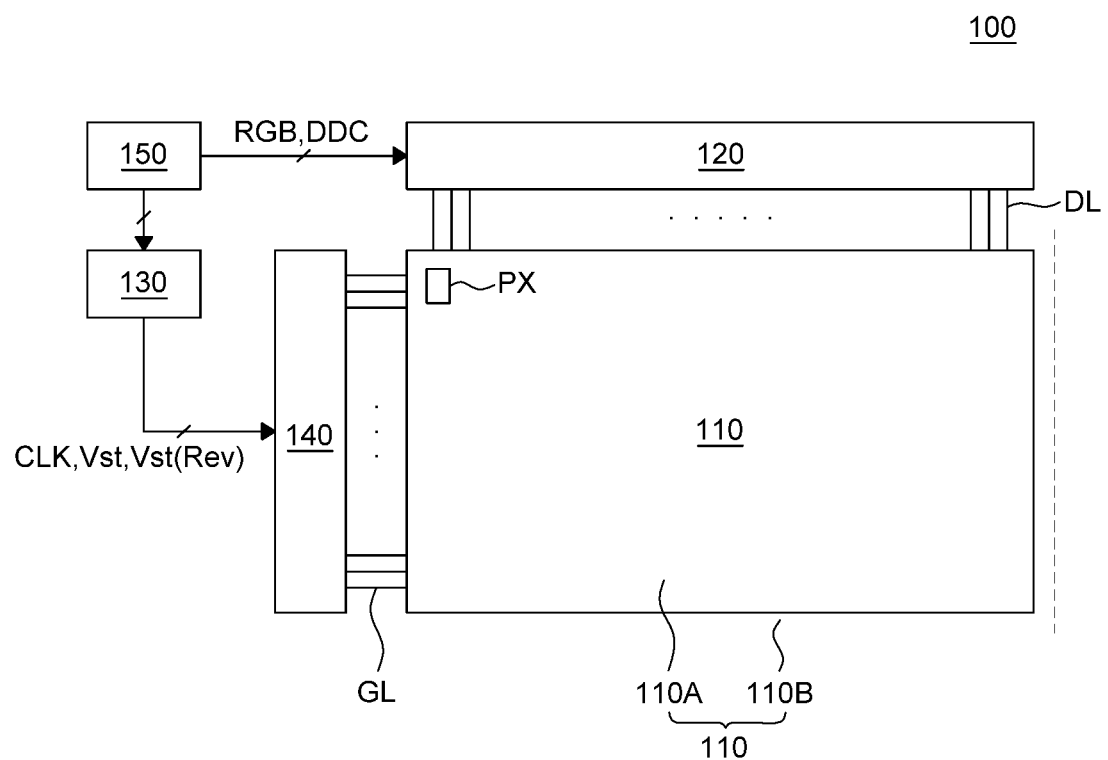
FIG. 1 is a block diagram of a display device including a shift register according to an embodiment of the present disclosure.

Advantages and features of the present disclosure and methods to achieve them will become apparent from the descriptions of example embodiments hereinbelow with reference to the accompanying drawings. However, the present disclosure is not limited to example embodiments disclosed herein but can be implemented in various different ways. The example embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies can be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C can be disposed between the elements A and B unless the term "directly" or "immediately" is explicitly used.

As used herein, a phrase "an element A on an element B" refers to that the element A can be disposed directly on the element B and/or the element A can be disposed indirectly on the element B via another element C.

The terms first, second and the like in the descriptions and in the claims are used for distinguishing between similar elements and not necessarily for describing a sequential or chronological order. These terms are used to merely distinguish one element from another. Accordingly, as used herein, a first element can be a second element within the technical idea of the present disclosure.

Like reference numerals denote like elements throughout the descriptions.

The drawings are not to scale and the relative dimensions of various elements in the drawings are depicted schematically and not necessarily to scale.

Features of various example embodiments of the present disclosure can be combined partially or totally. As will be clearly appreciated by those skilled in the art, technically various interactions and operations are possible. Various example embodiments can be practiced individually or in combination.

Hereinafter, example embodiments of the present disclosure will be described in detail with reference to the accompanying drawings.

FIG. 1 is a block diagram of a display device including a shift register according to an embodiment of the present disclosure. Referring to FIG. 1, a display device 100 includes a display panel 110, a timing controller 150, a data driver 120, and a scan driver 130 and 140.

The display panel 110 includes a plurality of pixels, each of which is defined by a plurality of data lines DL and a plurality of gate lines GL (or scan lines) intersecting one another and is connected to the data lines DL and the gate lines GL. The display panel 110 includes an active area 110A defined by the plurality of pixels PX and a non-active area where various signal lines, pads, and the like are formed. The display panel 110 can be implemented as a display panel used in various display devices such as a liquid-crystal display device, an organic light-emitting display device and an electrophoretic display device. In addition, the display panel 110 can be implemented as a display panel used in a display device for implementing a virtual reality. A display panel for implementing a virtual reality can be fabricated similarly to typical display panels. However, it is desirable to reduce the number of lines and the sizes of the scan driver because it is designed to have an ultra-high resolution.

A single pixel PX includes a transistor connected to gate lines GL and/or data lines DL, and a pixel circuit operating in response to a gate signal and a data signal supplied by the transistor. The pixel PX can be implemented with a liquid-crystal display panel including a liquid-crystal element or an organic light-emitting display panel including an organic light-emitting element depending on the configuration of the pixel circuit.

For example, when the display panel 110 is implemented with a liquid-crystal display panel, the display panel 110 can be implemented as a twisted nematic (TN) mode LCD, a vertical alignment (VA) mode LCD, an in plane switching (IPS) mode LCD, a fringe field switching (FFS) mode LCD, or an electrically controlled birefringence (ECB) mode LCD, etc. When the display panel 110 is implemented as an organic light-emitting display panel, the display panel 110 can be of a top-emission type, a bottom-emission type, or a dual-emission type.

The timing controller 150 receives timing signals, such as a vertical synchronization signal, a horizontal synchronization signal, a data enable signal and a dot clock, via a receiving circuit, such as LVDS and TMDS interfaces connected to an image board. The timing controller 150 generates timing control signals for controlling the operation timings of the data driver 120 and the scan driver 130 and 140 based on the received timing signals.

The data driver 120 includes a plurality of source drive integrated circuits (ICs). The plurality of source drive ICs receives digital video data RGB and a source timing control signal DDC from the timing controller 150. The source driver ICs convert the digital video data RGB into a gamma voltage in response to a source timing control signal DDC to generate a data voltage, and apply the data voltage via the data lines DL of the display panel 110. The source drive ICs are connected to the data lines DL of the display panel 110 by a chip-on-glass (COG) process or a tape automated bonding (TAB) process. The source drive ICs can be formed on the display panel 110 or can be formed on a separate PCB and connected to the display panel 110.

The scan driver 130 and 140 includes a level shifter 130 and a shift register 140. The level shifter 130 shifts the level of a clock signal CLK at a transistor-transistor-logic (TTL) level input from the timing controller 150, and then supplies it to the shift register 140. The shift register 140 can be formed in the non-active area 110B of the display panel 110 in the form of a transistor by using a GIP technique. The shift register 140 includes a plurality of stages ST (e.g., N stages, where N is a positive number (e.g., a positive integer)). for shifting a scan signal to output it in response to a clock signal CLK and a drive signal. The stages ST included in the shift register 140 sequentially output the scan outputs Gout via a plurality of output terminals.

The scan outputs Gout include a high-level voltage (VGH) and a low-level voltage (VGL). When a scan output Gout output through an output terminal is the high-level voltage VGH, a gate line GL of the display panel 110 receives the high-level voltage VGH and allows a pixel PX to emit light. Once the pixel PX emits light, the scan output Gout of the low-level voltage VGL is output from output terminal of the stage ST connected to the pixel PX so that a data signal to be transmitted to the next pixel PX is not introduced. It is preferable that the scan output Gout from the output terminal OUT of the stage ST is maintained at the high-level voltage VGH for a sufficient time while the pixel PX emits light.

Figure 2:
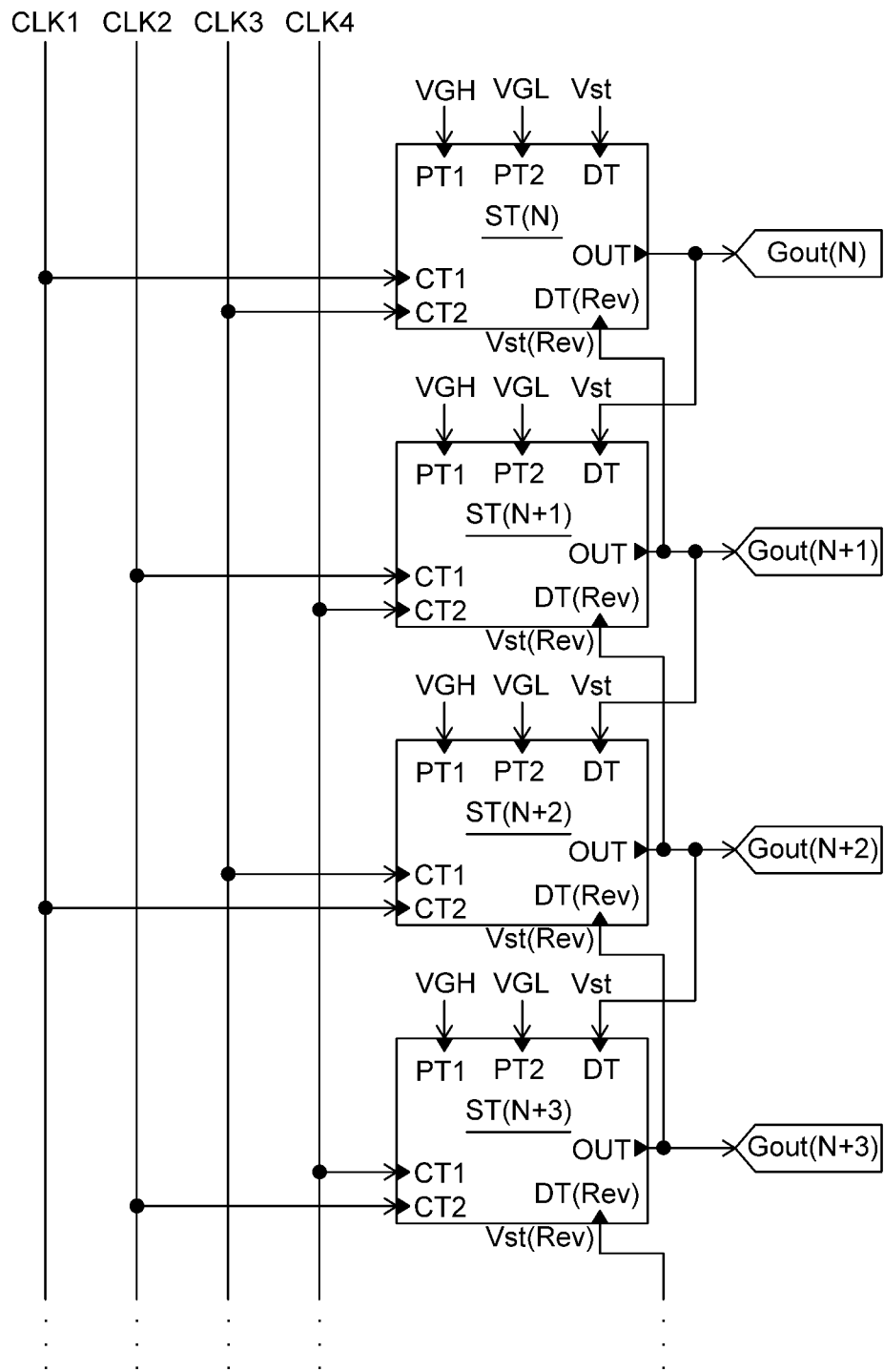
FIG. 2 is a block diagram of a shift register according to an embodiment of the present disclosure.
Figure 3:
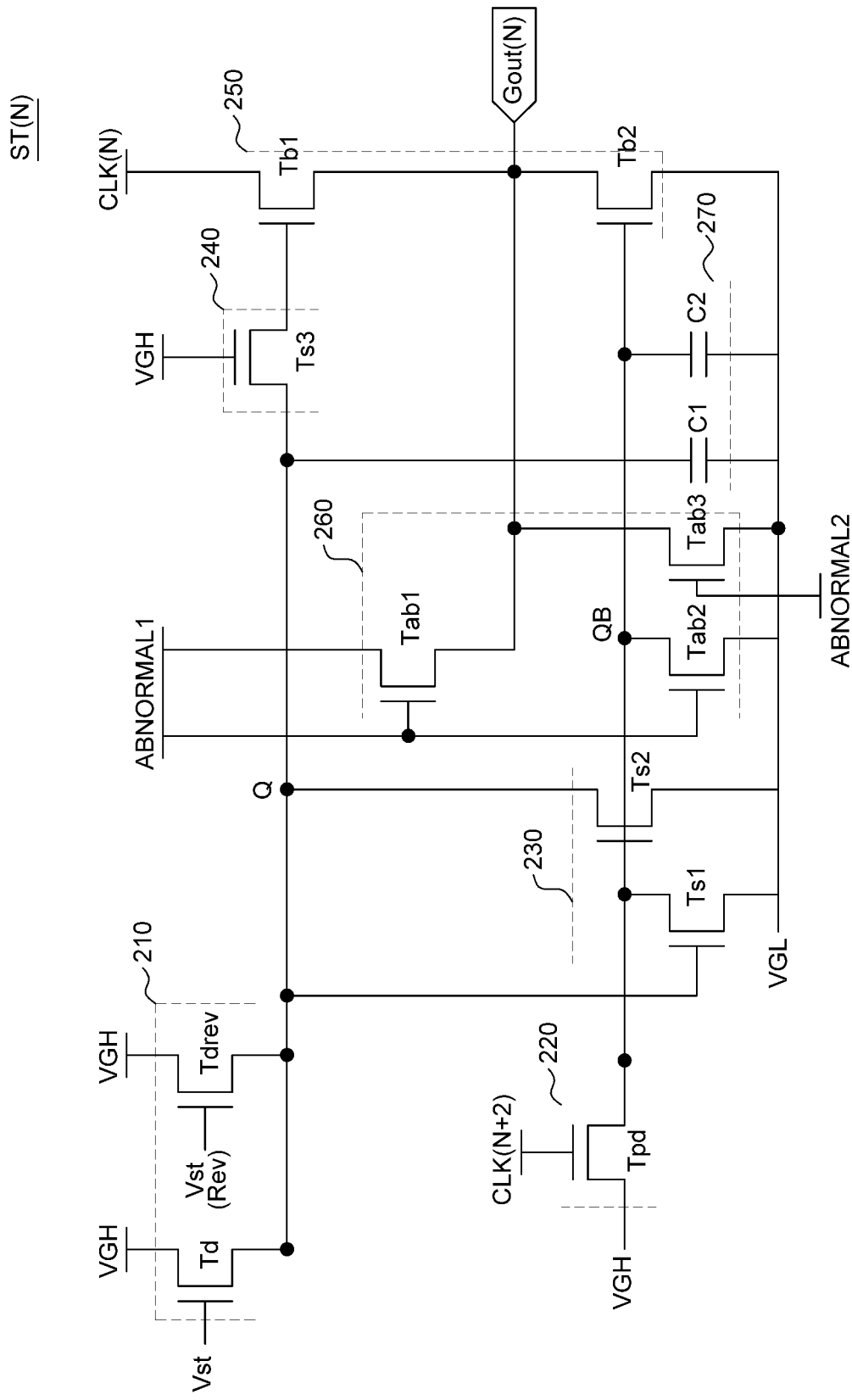
FIG. 3 is a circuit diagram of an $N^{th}$ stage of a shift register according to an embodiment of the present disclosure.

FIG. 2 is a block diagram of a shift register according to an embodiment of the present disclosure. FIG. 3 is a circuit diagram of an $N^{th}$ stage of a shift register according to an embodiment of the present disclosure.

Referring to FIG. 2, the shift register 140 includes a plurality of stages ST. The stages ST are connected to each other in a dependent manner, and each stage can output a scan output Gout, individually. In FIG. 2, the $N^{th}$ stage ST(N) to $(N+3)^{th}$ stage ST(N+3) are shown for convenience of illustration.

In the following description, a "previous stage" refers to at least one stage located at the previous (upper) position of a stage ST. A "subsequent stage" refers to at least one stage located at the subsequent (lower) position of a stage ST.

Each of the plurality of stages ST receives one of clock signals CLK having "i" different phases. For example, one of four clock signals CLK in phases sequentially delayed can be applied to each of the plurality of stages ST. The phases of the four clock signals CLK are delayed sequentially so that the pulses at logic HIGH are sequentially delayed and do not overlap with one another. The four clock signals CLK are sequentially output as the scan outputs Gout.

More specifically, when the stages ST are driven in the forward direction from the stage ST at the top to the stage ST at the bottom, the four clock signals CLK can have pulses at the high level in the order from the first clock signal CLK1, the second clock signal CLK2, the third clock signal CLK3 and the fourth clock signal CLK4. Further, when the stages ST are driven in the reverse direction from the stage ST at the bottom to the stage ST at the top, the four clock signals CLK can have pulses at the high level in the order from the fourth clock signal CLK4, the third clock signal CLK3, the second clock signal CLK2 and the first clock signal CLK1.

Referring to FIG. 2, each of the plurality of stages ST includes a forward drive terminal DT, a reverse drive terminal DT(Rev), a first clock terminal CT1, a second clock terminal CT2, a first power terminal PT1, a second power terminal PT2, and an output terminal OUT. It is, however, to be noted that the configuration of the terminals of the stages ST is not limited thereto.

The forward drive terminal DT can receive the scan output Gout applied from the previous stage ST as a driving signal. For example, the $N^{th}$ stage ST(N) can receive a scan output Gout(N−1) output from the output terminal OUT of the $(N−1)^{th}$ stage ST(N−1) as a driving signal. In some embodiments, the $N^{th}$ stage ST(N) can receive a forward start signal Vst applied separately as a driving signal, where N is a positive number (e.g., a positive integer). For example, when the $N^{th}$ stage ST(N) is the first stage ST located at the top, the forward start signal Vst can be applied separately as the driving signal.

The reverse drive terminal DT(Rev) can receive the scan output Gout applied from the subsequent stage ST as a driving signal. For example, the $N^{th}$ stage ST(N) can receive a scan output Gout(N+1) output from the output terminal OUT of the $(N+1)^{th}$ stage ST(N+1) as a driving signal. In some embodiments, the $N^{th}$ stage ST(N) can receive a reverse start signal Vst(Rev) applied separately as a driving signal. For example, when the $N^{th}$ stage ST(N) is the last stage ST located at the bottom, the reverse start signal Vst(Rve) can be applied from an external source as the driving signal.

Each of the first clock terminal CT1 and the second clock terminal CT2 can receive one of the clock signals CLK in different phases. Specifically, there can be a difference equal to two phases between the clock signal CLK applied to the first clock terminal CT1 and the clock signal CLK applied to the second clock terminal CT2. For example, the first clock signal CLK1 can be applied to the first clock terminal CT1 of the $N^{th}$ stage ST(N), and the third clock signal CLK3 can be applied to the second clock terminal CT2 thereof. The clock signal CLK input through the first clock terminal CT1 can be output via the output terminal OUT as the scan output Gout(N) of the $N^{th}$ stage ST(N).

A high-level voltage VGH can be applied to the first power terminal PT1, and a low-level voltage VGL can be applied to the second power terminal PT2. The high-level voltage VGH can be identical to the gate high voltage, and the low-level voltage VGL can be identical to the gate low voltage.

Accordingly, each of the plurality of stages ST is started when the forward start signal Vst is applied to the forward drive terminal DT or when the scan output Gout from the previous stage ST is applied, and then the clock signal CLK applied to the first clock terminal CT1 can be output as the scan output Gout. In addition, each of the plurality of stages ST is started when the reverse start signal Vst(Rev) is applied to the reverse drive terminal DT(Rev) or when the scan output Gout from the subsequent stage ST is applied, and then the clock signal CLK applied to the first clock terminal CT1 can be output as the scan output Gout.

Each of the stages ST will be described in detail with reference to FIG. 3. The $N^{th}$ stage ST(N) includes a first switching unit 210, a second switching unit 220, a third switching unit 220, a fourth switching unit 240, an output unit 250, an abnormal operation correcting unit 260, and a stabilizing unit 270. Although the $N^{th}$ stage ST(N) shown in FIG. 3 will be described as an example, the same can be equally applied to the other stages ST.

Referring to FIG. 3, the first switching unit 210 can receive a forward driving signal Vst or a reverse driving signal Vst(Rev) to control a Q-node Q. Specifically, the first switching unit 210 includes a forward driving transistor Td and a reverse driving transistor Tdrev.

The forward driving transistor Td can be used to charge the Q-node with the high-level voltage VGH in response to the forward driving signal Vst. The forward driving signal Vst can be the scan output Gout(N−1) from the $(N-1)^{th}$ stage ST(N−1), which is the previous stage ST of the $N^{th}$ stage S(N) or can be a separate forward start signal Vst applied from the level shifter 130. When the $N^{th}$ stage ST(N) is the first stage at the top, the forward driving signal Vst can be a separate forward start signal Vst. On the other hand, when the $N^{th}$ stage ST(N) is not the first stage at the top, the forward driving signal Vst can be the scan output Gout(N−1) from the $(N-1)^{th}$ stage ST(N−1) which is the previous stage.

The gate electrode of the forward driving transistor Td can be connected to the forward drive terminal DT to receive the forward driving signal Vst. The drain electrode of the forward driving transistor Td can be connected to the first power terminal PT1 to receive the high-level voltage VGH. The source electrode of the forward driving transistor Td can be connected to the Q-node Q. When the forward driving signal Vst is applied to the gate electrode of the forward driving transistor Td, the high-level voltage VGH applied to the drain electrode can be charged at the Q-node Q connected to the source electrode.

The reverse driving transistor Tdrev can be used to charge the Q-node with the high-level voltage VGH in response to the reverse driving signal Vst(Rev). The reverse driving signal Vst(Rev) can be the scan output Gout(N+1) from the $(N+1)^{th}$ stage ST(N+1), which is the subsequent stage of the $N^{th}$ stage ST(N) or can be a reverse start signal Vst(Rev) applied separately from the level shifter 130. When the $N^{th}$ stage ST(N) is the last stage at the bottom, the reverse driving signal Vst(Rev) can be a separate reverse start signal Vst(Rev). On the other hand, when the $N^{th}$ stage ST(N) is not the last stage at the bottom, the reverse driving signal Vst(Rev) can be the scan output Gout(N+1) from the $(N+1)^{th}$ stage ST(N+1), which is the subsequent stage.

The gate electrode of the reverse driving transistor Tdrev can be connected to the reverse drive terminal DT(Rev) to receive the reverse driving signal Vst(Rev). The drain electrode of the reverse driving transistor Tdrev can be connected to the first power terminal PT1 to receive the high-level voltage VGH. The source electrode of the reverse driving transistor Td can be connected to the Q-node Q. When the reverse driving signal Vst(Rev) is applied to the gate electrode of the reverse driving transistor Tdrev, the high-level voltage VGH applied to the drain electrode can be charged at the Q-node Q connected to the source electrode.

The second switching unit 220 can receive the $(N+2)^{th}$ clock signal CLK(N+2) to control a QB-node QB. For example, the second switching unit 220 applies the high-level voltage VGH to the QB-node QB in response to the $(N+2)^{th}$ clock signal CLK(N+2). The second switching unit 220 includes a pull-down transistor Tpd.

The pull-down transistor Tpd can be used to charge the QB-node QB with the high-potential voltage VGH in response to the $(N+2)^{th}$ clock signal CLK(N+2). For example, the $(N+2)^{th}$ clock signal CLK(N+2) can be the third clock signal CLK3. The gate electrode of the pull-down transistor Tpd can be connected to the second clock terminal CT2 to receive the $(N+2)^{th}$ clock signal CLK(N+2). The drain electrode of the pull-down transistor Tdp can be connected to the first power terminal PT1 to receive the high-level voltage VGH. The source electrode of the pull-down transistor Tpd can be connected to the QB-node QB. When $(N+2)^{th}$ clock signal CLK(N+2) is applied to the gate electrode of the pull-down transistor Tpd, the high-level voltage VGH applied to the drain electrode can be charged at the QB-node QB connected to the source electrode.

When the Q-node Q is charged with the high-level voltage VGH, the third switching unit 230 can discharge the QB-node QB to the low-level voltage VGL. When the QB-node QB is charged with the high-level voltage VGH, the third switching unit 230 can discharge the Q-node Q to the low-level voltage VGL. The third switching unit 230 can include a first switching transistor Ts1 and a second switching transistor Ts2.

The first switching transistor Ts1 can be used to discharge the QB-node QB to the low-level voltage VGL in response to the voltage applied to the Q-node Q. The gate electrode of the first switching transistor Ts1 can be connected to the Q-node Q to receive the voltage at the Q-node Q. When the Q-node Q is charged with the high-level voltage VGH, it can receive the high-level voltage VGH. The drain electrode of the first switching transistor Ts1 can be connected to the second power terminal PT2 to receive the low-level voltage VGL. The source electrode of the first switching transistor Ts1 can be connected to the QB-node QB. The first switching transistor Ts1 can discharge the QB-node QB connected to the source electrode to the low-level voltage VGL applied to the drain electrode as the high-level voltage VGH is applied to the Q-node Q.

The second switching transistor Ts2 can be used to discharge the Q-node Q to the low-level voltage VGL in response to the voltage applied to the QB-node QB. The gate electrode of the second switching transistor Ts2 can be connected to the QB-node QB to receive the voltage at the QB-node QB. When the QB-node QB is charged with the high-level voltage VGH, the QB-node QB can receive the high-level voltage VGH. The drain electrode of the second switching transistor Ts2 can be connected to the second power terminal PT2 to receive the low potential voltage VGL. The source electrode of the second switching transistor Ts2 can be connected to the Q-node Q. The second switching transistor Ts1 can be used to discharge the Q-node Q connected to the source electrode to the low-level voltage VGL applied to the drain electrode as the high-level voltage VGH is applied to the QB-node QB.

Although the stage shown in FIG. 3 includes the third switching unit 230, the third switching unit 230 can be eliminated in some implementations.

The fourth switching unit 240 can separate the output unit 250 from the Q-node Q so that the output unit 250 is not directly connected to the Q-node Q. The fourth switching unit 240 includes a third switching transistor Ts3.

The third switching transistor Ts3 can apply the voltage applied to the Q-node Q to the gate electrode of a first buffer transistor Tb1 of the output unit 250 in response to the high-level voltage VGH. Specifically, the gate electrode of the third switching transistor Ts3 can be connected to the first power terminal PT1 to receive the high-level voltage VGH. The drain electrode of the third switching transistor Ts3 can be connected to the Q-node Q. The source electrode of the third switching transistor Ts3 can be connected to the gate electrode of the first buffer transistor Tb1 of the output unit 250. The third switching transistor Ts3 is always turned on by the high-level voltage VGH applied to the gate electrode and accordingly the voltage applied to the Q-node Q applied to the drain electrode can be applied to the gate electrode of the first buffer transistor Tb1.

Although the stage shown in FIG. 3 includes the fourth switching unit 240, the fourth switching unit 240 can be eliminated in some implementations. When the fourth switching unit 240 is eliminated, the gate electrode of the first buffer transistor Tb1 of the output unit 250 can be connected to the Q-node Q.

The stabilizing unit 270 can stabilize the voltage applied to the Q-node Q and the QB-node QB. The stabilizing unit 270 includes a first capacitor C1 and a second capacitor C2.

The first capacitor C1 can be connected to the Q-node Q to store the voltage applied to the Q-node Q, thereby stabilizing the voltage applied to the Q-node Q. The second capacitor C2 can be connected to the QB-node QB to store the voltage applied to the QB-node QB, thereby stabilizing the voltage applied to the QB-node QB.

Although the stage shown in FIG. 3 includes the stabilizing unit 270, the stabilizing unit 270 can be eliminated in some implementations.

The output unit 250 can output the scan output Gout(N) to the output terminal OUT. Specifically, the output unit 250 outputs the $N^{th}$ clock signal CLK(N) to the output terminal OUT based on the voltage at the Q-node Q. The output unit 250 includes a first buffer transistor Tb1 and a second buffer transistor Tb2.

The first buffer transistor Tb1 can output the $N^{th}$ scan output Gout(N) to the output terminal OUT in response to the voltage applied to the Q-node Q. Specifically, the gate electrode of the first buffer transistor Tb1 is connected to the source electrode of the third switching transistor Ts3 of the fourth switching unit 240. The drain electrode of the first buffer transistor Tb1 is connected to the first clock terminal CT1 and receives the $N^{th}$ clock signal CLK(N). For example, the drain electrode of the first buffer transistor Tb1 can receive the first clock signal CLK1. The source electrode of the first buffer transistor Tb1 is connected to the output terminal OUT. The first buffer transistor Tb1 can output the $N^{th}$ clock signal CLK(N) to the output terminal OUT connected to the drain electrode as the scan output Gout(N) from the $N^{th}$ stage ST(N) by the high-level voltage VGH applied to the source electrode of the third switching transistor Ts3 of the fourth switching unit 240. As described above, since the high-level voltage VGH is always applied to the gate electrode of the third switching transistor Ts3, the third switching transistor Ts3 is always turned on. Therefore, the voltage applied to the Q-node Q can always be applied to the gate electrode of the first buffer transistor Tb1. Accordingly, when the high-level voltage VGH is applied to the Q-node Q, the first buffer transistor Tb1 can output the $N^{th}$ clock signal CLK(N) as the $N^{th}$ scan output from the $N^{th}$ stage ST(N).

The second buffer transistor Tb2 can output the scan output Gout(N) to the output terminal OUT in response to the voltage applied to the QB-node QB. Specifically, the gate electrode of the second buffer transistor Tb2 is connected to the QB-node QB. The drain electrode of the second buffer transistor Tb2 is connected to the second power terminal PT2 to receive the low-level voltage VGL. The source electrode of the second buffer transistor Tb2 is connected to the output terminal OUT. The second buffer transistor Tb2 can output the low-level voltage VGL as the scan output Gout (N) from the $N^{th}$ stage ST(N) by the voltage applied to the QB-node QB. When the high-level voltage VGH is applied to the QB-node QB, the second buffer transistor Tb2 is turned on, such that the low-level voltage VGL can be output as the scan output Gout (N) from the $N^{th}$ stage ST(N).

The abnormal operation correcting unit 260 applies the high-level voltage VGH or the low-level voltage VGL to the output terminal OUT when an abnormal operation occurs in the $N^{th}$ stage ST(N) or the shift register 140. The abnormal operation correcting unit 260 includes a first abnormal operation transistor Tab1, a second abnormal operation transistor Tab2, and a third abnormal operation transistor Tab3.

The first abnormal operation transistor Tab1 can output a first abnormal operation signal ABNORMAL1 to the output terminal OUT in response to the first abnormal operation signal ABNORMAL1. The first abnormal operation signal ABNORMAL1 is a signal applied when the $N^{th}$ stage ST(N) performs an abnormal operation instead of a normal operation, to output the high-level voltage VGH as the scan output Gout(N) voltage from the $N^{th}$ stage ST(N). Specifically, the first abnormal operation signal ABNORMAL1 can be applied to the gate electrode and the drain electrode of the first abnormal operation transistor Tab1. The source electrode of the first abnormal operation transistor Tab1 can be connected to the output terminal OUT. When the $N^{th}$ stage ST(N) performs an abnormal operation, the first abnormal operation signal ABNORMAL1 is applied to the gate electrode of the first abnormal operation transistor Tab1 so that the first abnormal operation transistor Tab1 can be turned on. At this time, the first abnormal operation signal ABNORMAL1 applied to the drain electrode of the first abnormal operation transistor Tab1 is the high-level voltage VGH, and accordingly the scan output Gout(N) from the $N^{th}$ stage ST(N) at the high-level voltage VGH can be output to the output terminal OUT connected to the source electrode of the first abnormal operation transistor Tab1.

The second abnormal operation transistor Tab2 can output the low-level voltage VGL to the QB-node in response to the first abnormal operation signal ABNORMAL1. The first abnormal operation signal ABNORMAL1 is applied to the gate electrode of the second abnormal operation transistor Tab2. The drain electrode of the second abnormal operation transistor Tab2 is connected to the second power terminal PT2 to receive the low-level voltage VGL. The source electrode of the second abnormal operation transistor Tab2 is connected to the QB-node QB. When the first abnormal operation signal ABNORMAL1 is applied to the gate electrode of the second abnormal operation transistor Tab2, the second abnormal operation transistor Tab2 can be turned on. At this time, the low-level voltage VGL applied to the drain electrode of the second abnormal operation transistor Tab2 can be applied to the QB-node QB connected to the source electrode of the first abnormal operation transistor Tab1.

The third abnormal operation transistor Tab3 can be used to apply the low-level voltage VGL to the output terminal OUT in response to the second abnormal operation signal ABNORMAL2. The second abnormal operation signal ABNORMAL2 is a signal applied when the $N^{th}$ stage ST(N) performs an abnormal operation instead of a normal operation, to output the low-level voltage VGL as the scan output Gout(N) voltage from the $N^{th}$ stage ST(N). In addition, the first abnormal operation signal ABNORMAL1 and the second abnormal operation signal ABNORMAL2 may not be applied at the same time. The second abnormal operation signal ABNORMAL2 can be applied to the gate electrode of the third overtravel transistor Tab3. The drain electrode of the third abnormal operation transistor Tab3 is connected to the second power terminal PT2 to receive the low-level voltage VGL. The source electrode of the third abnormal operation transistor Tab3 can be connected to the output terminal OUT. When the second abnormal operation signal ABNORMAL2 is applied to the gate electrode of the third abnormal operation transistor Tab3, the third abnormal operation transistor Tab3 can be turned on. In this instance, the low-level voltage VGL applied to the drain electrode of the third abnormal operation transistor Tab3 is applied to the output terminal OUT connected to the source electrode of the third abnormal operation transistor Tab3, the low-level voltage VGL can be output as the scan output Gout(N) of the $N^{th}$ stage ST(N).

Although the stage shown in FIG. 3 includes all of the first to third abnormal operation transistors Tab1 to Tab3, the third abnormal operation transistor Tab3 can be eliminated in some implementations.

In addition, although the stage shown in FIG. 3 includes the abnormal operation correcting unit 260, the abnormal operation correcting unit 260 can be eliminated in some implementations.

Figure 4A:
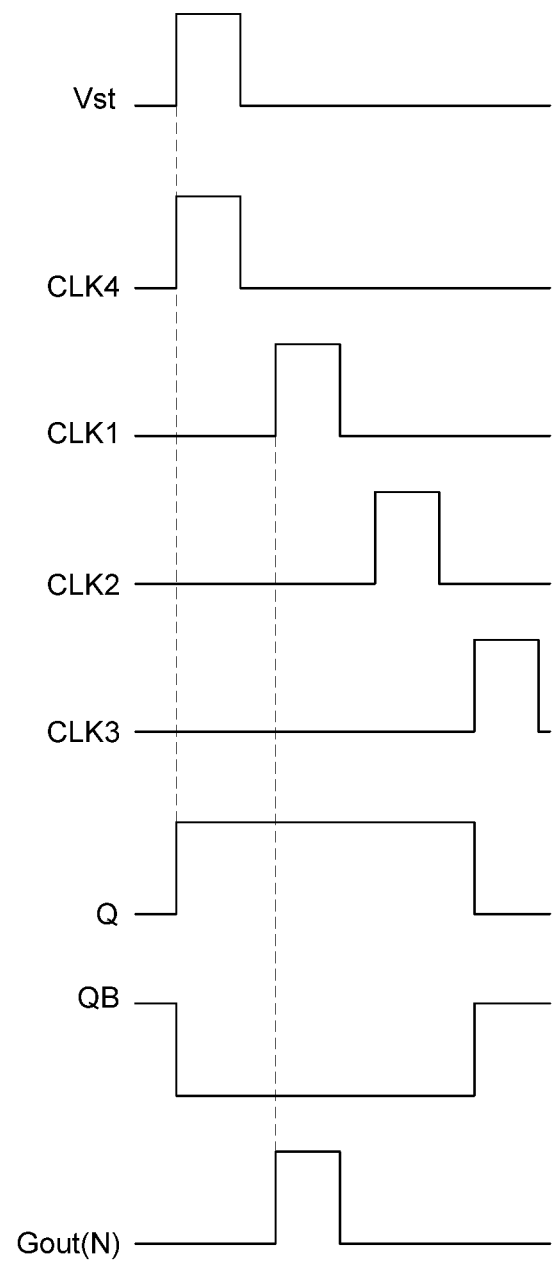
FIGS. 4A and 4B are diagrams showing waveforms of driving signals for the $N^{th}$ stage shown in FIG. 3.
Figure 4B:
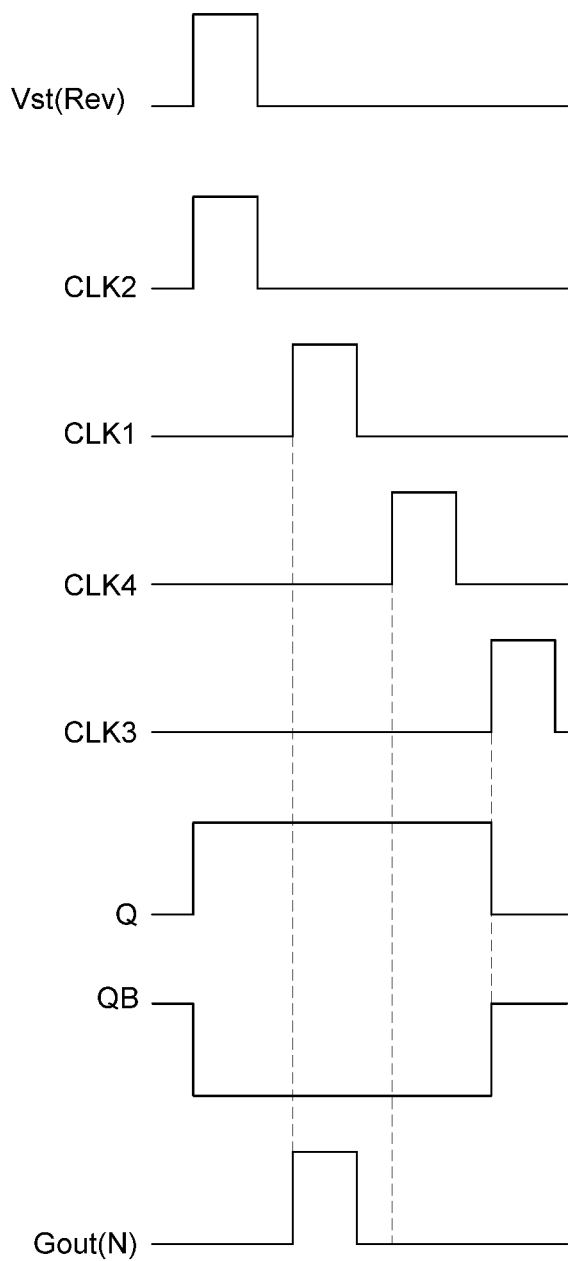

FIGS. 4A and 4B are diagrams showing waveforms of driving signals for the $N^{th}$ stage shown in FIG. 3. FIG. 4A is a diagram showing a waveform of a driving signal when the $N^{th}$ stage ST(N) is driven in the forward direction, and FIG. 4B is a diagram showing a waveform of a driving signal when the $N^{th}$ stage ST(N) is driven in the reverse direction. The waveforms shown in FIGS. 4A and 4B are merely illustrative but are not limiting.

The forward driving will be described first with reference to FIG. 4A. The four clock signals CLK have different phases, and the first to fourth clock signals CLK1 to CLK4 sequentially have pulses at the high level. That is to say, the first clock signal CLK1, the second clock signal CLK2, the third clock signal CLK3 and the fourth clock signal CLK4 sequentially have pulses at the high level in this order. The first clock signal CLK1 to the fourth clock signal CLK4 do not overlap with one another. It is, however, to be understood that the present disclosure is not limited thereto. Although the four clock signals CLK in different phases are used in this example embodiment, the present disclosure is not limited thereto.

Initially, when the fourth clock signal CLK4 or the forward start signal Vst is switched to the high level, the Q-node Q is charged to the high-level voltage VGH, and the QB-node QB is discharged to the low-level voltage VGL.

As described above, the scan output Gout(N-1) from the $(N-1)^{th}$ stage ST(N-1) or the forward start signal Vst can be applied to the forward drive terminal DT of the $N^{th}$ stage ST(N). The scan output Gout(N-1) from the $(N-1)^{th}$ stage ST(N-1) can be the fourth clock signal CLK4. When the fourth clock signal CLK4 or the forward start signal Vst which is switched to the high level is applied to the forward drive terminal DT of the $N^{th}$ stage ST(N), the forward driving transistor Td is turned on, and the Q-node Q can be charged with the high-level voltage VGH. When high-level voltage VGH is applied to the Q-node Q, the first switching transistor Ts1 is turned on such that the QB-node QB is charged with the low-level voltage VGL.

When the high-level voltage VGH is applied to the Q-node Q, the first buffer transistor Tb1 of the output unit 250 is turned on. When the first buffer transistor Tb1 is turned on, the first clock signal CLK1 is output to the output terminal OUT as the scan output Gout(N) from the $N^{th}$ stage ST(N).

Subsequently, when the first clock signal CLK1 is switched to the high level, the first clock signal CLK1 at the high-level voltage VGH is output as the scan output Gout(N) from the $N^{th}$ stage ST(N). When high-level voltage VGH is applied to the Q-node Q, the first clock signal CLK1 is output as the scan output Gout(N) from the $N^{th}$ stage ST(N), and accordingly the clock signal CLK1 is switched to the high level, such that the high-level voltage VGH is output to the scan output Gout(N) of the $N^{th}$ stage ST(N). Then, when the first clock signal CLK1 is switched to the low level, the first clock signal CLK1 at the low-level voltage VGL is output as the scan output Gout(N) from the $N^{th}$ stage ST(N).

Subsequently, when the third clock signal CLK3 is switched to the high level, the Q-node Q is discharged to the low-level voltage VGL, the QB-node QB is charged to the high-level voltage VGH, and the scan output Gout(N) at the low-level voltage VGL is output from the $N^{th}$ stage ST(N).

As the third clock signal CLK3 is switched to the high voltage, the pull-down transistor Tpd of the second switching unit 220 is turned on. When the pull-down transistor Tpd is turned on, the high-potential voltage VGH is charged at the QB-node QB.

As the high-potential voltage VGH is charged at the QB-node QB, the second switching transistor Ts2 of the third switching unit 230 is turned on. When the second switching transistor Ts2 is turned on, the Q-node Q is discharged to the low-level voltage VGL. When the low-level voltage VGL is applied to the Q-node Q, the first buffer transistor Tb1 of the output unit 250 is turned off.

As the high-level voltage VGH is applied to the QB-node QB, the second buffer transistor Tb2 of the output unit 250 is turned on. When the second buffer transistor Tb2 is turned on, the low-level voltage VGL is applied to the output terminal OUT, and the low-level voltage VGL is output as the scan output Gout(N) from the $N^{th}$ stage ST(N).

Next, the reverse driving will be described with reference to FIG. 4B. The second clock signal CLK2, the first clock signal CLK1, the fourth clock signal CLK4 and the third clock signal CLK3 have pulses in this order. That is to say, unlike when the forward driving signal Vst is applied as described above with respect to FIG. 4A, the fourth clock signal CLK4, the third clock signal CLK3, the second clock signal CLK2 and the first clock signal CLK1 are switched to the high level in this order.

Initially, when the second clock signal CLK2 or the reverse start signal Vst(Rev) is switched to the high level, the Q-node Q is charged to the high-level voltage VGH, and the QB-node QB is discharged to the low-level voltage VGL.

As described above, the scan output Gout(N−1) from the (N−1)$^{th}$ stage ST(N−1) or the reverse start signal Vst(Rev) can be applied to the reverse drive terminal DT(Rev) of the N$^{th}$ stage ST(N). The scan output Gout(N−1) from the (N−1)$^{th}$ stage ST(N−1) can be the second clock signal CLK2. When the second clock signal CLK2 or the reverse start signal Vst(Rev) which is switched to the high level is applied to the reverse drive terminal DT(Rev) of the N$^{th}$ stage ST(N), the reverse driving transistor Tdrev is turned on, and the Q-node Q can be charged with the high-level voltage VGH. As the high-level voltage VGH is applied to the Q-node Q, the first switching transistor Ts1 is turned on such that the QB-node QB is charged with the low-level voltage VGL.

As the high potential voltage VGH is applied to the Q-node Q, the first buffer transistor Tb1 of the output unit 250 is turned on As the first buffer transistor Tb1 is turned on, the first clock signal CLK1 is output to the output terminal OUT as the scan output Gout(N) from the N$^{th}$ stage ST(N).

Subsequently, when the first clock signal CLK1 is switched to the high level, the first clock signal CLK1 at the high-level voltage VGH is output as the scan output Gout(N) from the N$^{th}$ stage ST(N). When the high-level voltage VGH is applied to the Q-node Q, the first clock signal CLK1 is output as the scan output Gout(N) from the N$^{th}$ stage ST(N), and accordingly the clock signal CLK1 is switched to the high level, such that the high-level voltage VGH is output to the scan output Gout(N) of the N$^{th}$ stage ST(N). Then, when the first clock signal CLK1 is switched to the low level, the first clock signal CLK1 at the low-level voltage VGL is output as the scan output Gout(N) from the N$^{th}$ stage ST(N).

Subsequently, the third clock signal CLK3 is switched to the high level, the Q-node Q is discharged to the low-level voltage VGL, the QB-node QB is charged to the high-level voltage VGH, and the scan output Gout(N) at the low-level voltage VGL is output from the N$^{th}$ stage ST(N).

As the third clock signal CLK3 is switched to the high voltage, the pull-down transistor Tpd of the second switching unit 220 is turned on. When the pull-down transistor Tpd is turned on, the high-potential voltage VGH is charged at the QB-node QB.

As the high-potential voltage VGH is charged at the QB-node QB, the second switching transistor Ts2 of the third switching unit 230 is turned on. As the second switching transistor Ts2 is turned on, the Q-node Q is discharged to the low potential voltage VGL. When the low-level voltage VGL is applied to the Q-node Q, the first buffer transistor Tb1 of the output unit 250 is turned off.

As the high-level voltage VGH is applied to the QB-node QB, the second buffer transistor Tb2 of the output unit 250 is turned on. When the second buffer transistor Tb2 is turned on, the low-level voltage VGL is applied to the output terminal OUT, and the low-level voltage VGL is output as the scan output Gout(N) from the N$^{th}$ stage ST(N).

In existing shift registers, a plurality of stages could be driven only in the direction from the stage at the top to the stage at the bottom. In other words, the existing shift registers can be driven only in one direction. Accordingly, in existing shift registers, when a display panel in which a shift register is formed is placed in reverse during the process of assembling the display panel with the display device, the shift register cannot operate in the reverse direction.

In contrast, in the shift register 140 according to an embodiment of the present disclosure and the display device including the same, the first switching unit 210 of each of the plurality of stages ST includes the forward driving transistor Td and the reverse driving transistor Tdrev, so that the plurality of stages ST can be driven in both directions. According to an embodiment, the shift register can still operate even if the shift register is assembled backwards in the display panel (e.g., placed in reverse). Specifically, when the forward start signal Vst or the scan output Gout(N−1) from the previous stage ST(N−1) is applied to the forward driving transistor Td, the N$^{th}$ clock signal CLK(N) can be output as the scan output Gout(N) from the N$^{th}$ stage ST(N). Then, the scan output Gout(N) from the N$^{th}$ stage ST(N) can be applied to the forward drive terminal DT of the (N+1)$^{th}$ stage ST(N+1). Therefore, the plurality of stages ST can be driven in the forward direction from the first stage ST at the top to the last stage ST at the bottom. On the other hand, when the reverse start signal Vst(Rev) or the scan output Gout(N+1) from the subsequent stage ST(N+1) is applied to the reverse driving transistor Tdrev, the N$^{th}$ clock signal CLK(N) can be output as the scan output Gout(N) from the N$^{th}$ stage ST(N). Then, the scan output Gout(N) from the N$^{th}$ stage ST(N) can be applied to the reverse drive terminal DT(Rev) of the (N−1)$^{th}$ stage ST(N−1). Therefore, the plurality of stages ST can be driven in the reverse direction from the stage ST at the bottom to the first stage ST at the top. Accordingly, the plurality of stages ST can be driven not only when the driving signal is applied to the first stage ST of the shift register 140 but also when the driving signal is applied to the last stage ST at the bottom.

In addition, in the shift register 140 according to an embodiment of the present disclosure and the display device including the same, the number of elements included in the shift register 140 that can be driven bi-directionally can be reduced, so that the area occupied by the shift register 140 can be reduced. Specifically, for the bidirectional driving of the shift register, additional lines and transistors can be used as compared with existing shift registers driven in one direction. For example, signal lines for transmitting signals for the reverse driving can be added in addition to the signal lines for the forward driving. In addition, a pull-down transistor for the reverse driving can be added in addition to a pull-down transistor for the forward driving. However, the stages ST of the shift register 140 according to an embodiment of the present disclosure do not use additional signal lines for the reverse driving. In addition, the stages ST include none of a pull-down transistor for the forward driving and a pull-down transistor for the reverse driving. Instead, the stages ST include only one pull-down transistor Tpd. Thus, the stages ST can be driven in both directions even with a less number of lines and transistors. In addition, the area occupied by the shift register 140 can be reduced. Thus, the area of the non-display area 110B of the display device 100 can be reduced.

Figure 5:
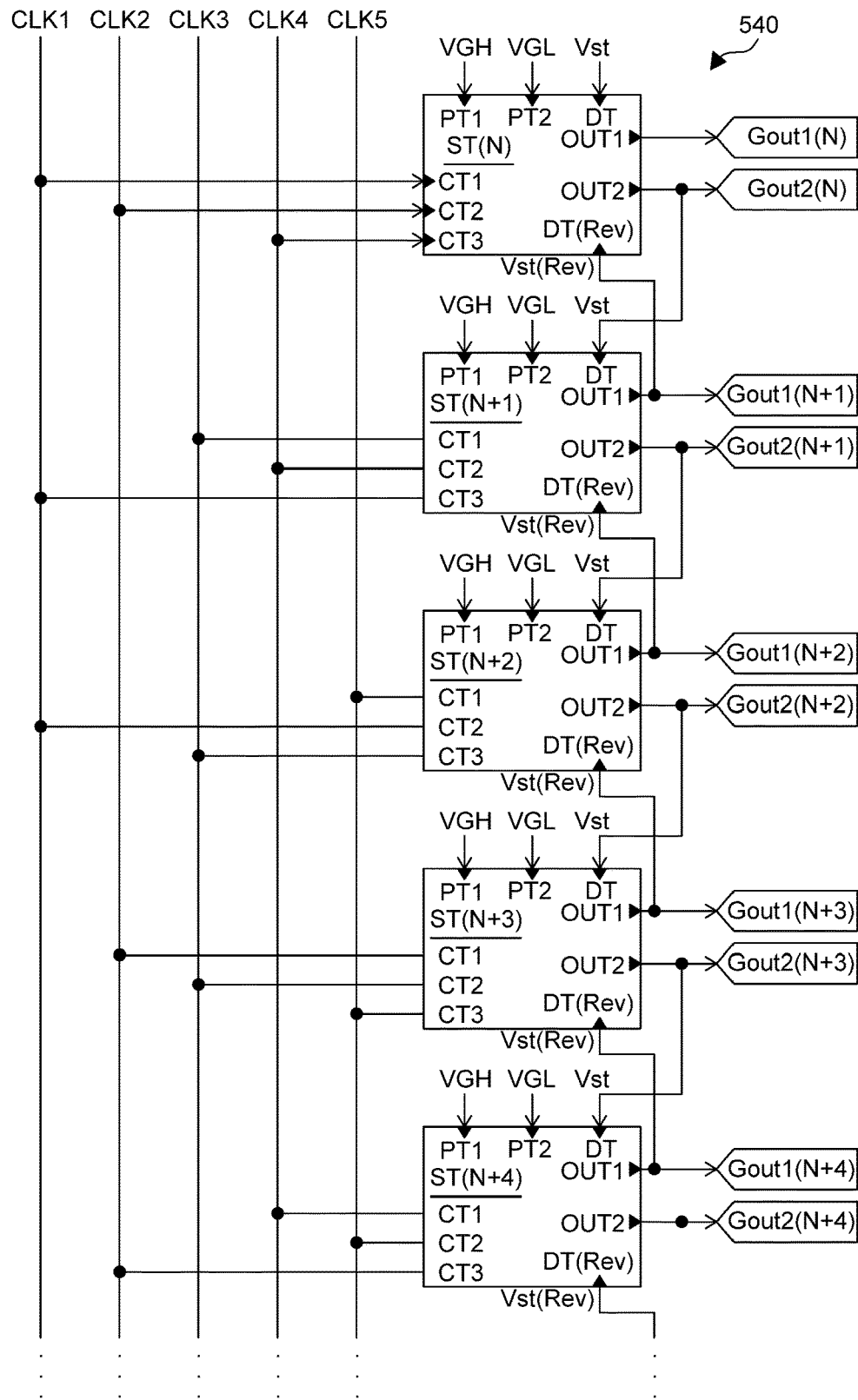
FIG. 5 is a block diagram of a shift register according to another embodiment of the present disclosure.
Figure 6:
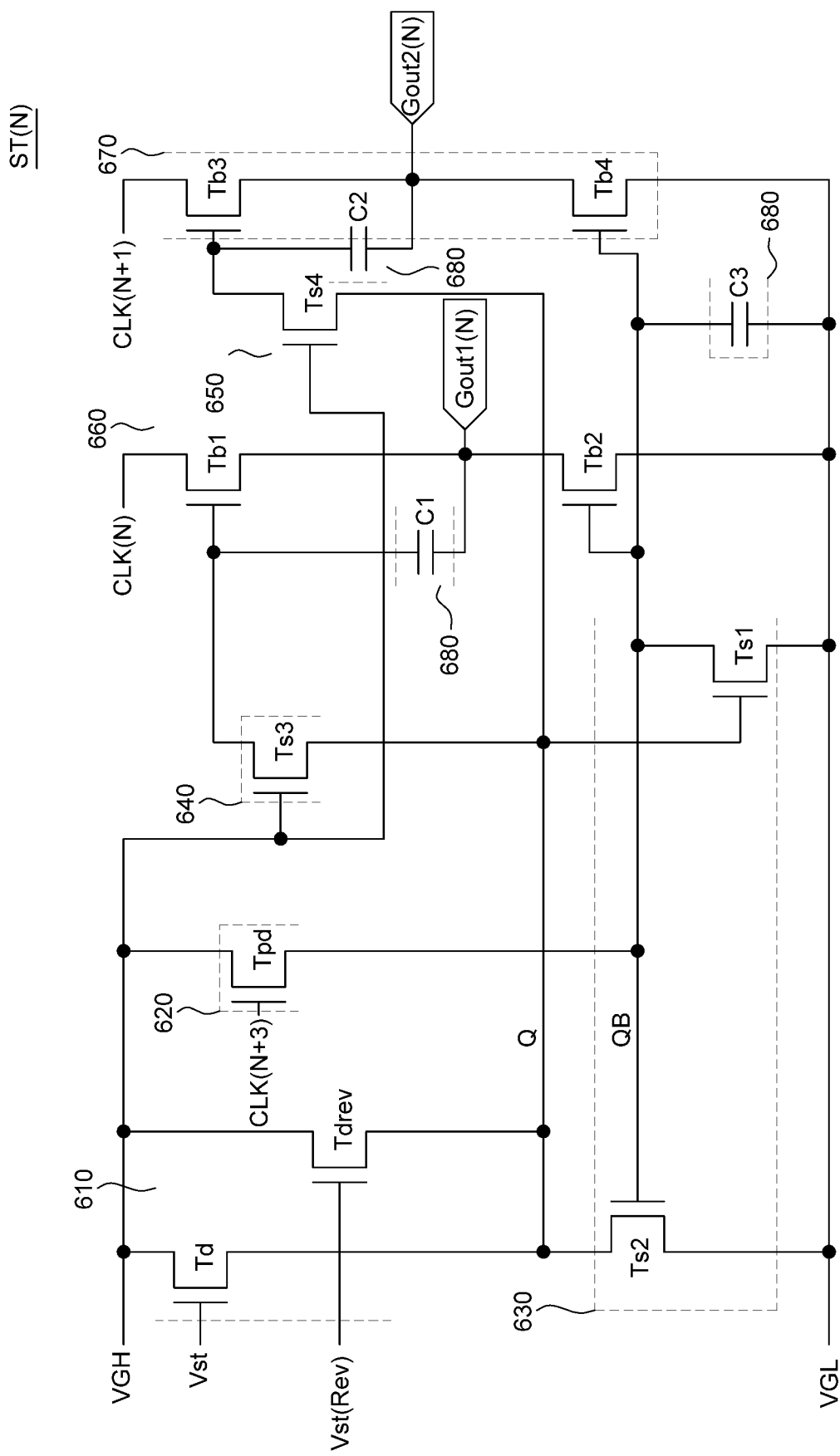
FIG. 6 is a circuit diagram of an $N^{th}$ stage of a shift register according to another embodiment of the present disclosure.

FIG. 5 is a block diagram of a shift register according to another embodiment of the present disclosure. FIG. 6 is a circuit diagram of an N$^{th}$ stage of a shift register according to another embodiment of the present disclosure. A shift register 540 of FIGS. 5 and 6 is substantially identical to the shift register 140 of FIG. 1 to FIG. 3 except that the configurations of the clock terminals CT1 and CT2 and output units 660 and 670 are different and there is no abnormal operation correcting unit; and, therefore, the redundant description will be omitted.

Referring to FIG. 5, the shift register 540 includes a plurality of stages ST. The stages ST are connected to each other in a dependent manner, and each can output scan outputs Gout1(N) and Gout2(N) individually. In FIG. 5, the N$^{th}$ stage ST(N) to (N+4)$^{th}$ stage ST(N+4) are shown for convenience of illustration.

Each of the plurality of stages ST receives one of clock signals CLK having """" different phases. For example, one of five clock signals CLK in phases sequentially delayed can be applied to each of the plurality of stages ST. The phases of the five clock signals CLK are delayed sequentially so that the pulses at logic HIGH are sequentially delayed. The pulses at the high level of the clock signals CLK do not overlap with each other. The five clock signals CLK are sequentially output as the scan outputs Gout1(N) and Gout2(N).

More specifically, when the stages ST are driven in the forward direction from the first stage ST at the top to the last stage ST at the bottom, the pulses of the five clock signals CLK can become high level in the order from the first clock signal CLK1, the second clock signal CLK2, the third clock signal CLK3, the fourth clock signal CLK4 and the fifth clock signal CLK5. Further, when the stages ST are driven in the reverse direction from the stage ST at the bottom to the stage ST at the top, the pulses of the five clock signals CLK can become high level in the order from the fifth clock signal CLK5, the fourth clock signal CLK4, the third clock signal CLK3, the second clock signal CLK2 and the first clock signal CLK1.

Referring to FIG. 5, each of the plurality of stages ST includes a forward drive terminal DT, a reverse drive terminal DT(Rev), a first clock terminal CT1, a second clock terminal CT2, a third clock terminal CT3, a first power terminal PT1, a second power terminal PT2, a first output terminal OUT1 and a second output terminal OUT2. It is, however, to be noted that the configuration of the terminals of the stages ST is not limited thereto.

The forward drive terminal DT can receive the scan output Gout2(N−1) applied from the previous stage ST as a driving signal. For example, the N$^{th}$ stage ST(N) can receive a second scan output Gout2(N−1) output from the second output terminal OUT2 of the (N−1)$^{th}$ stage ST(N−1) as a driving signal. In some embodiments, the N$^{th}$ stage ST(N) can receive a forward start signal Vst applied separately from the level shifter 130 as a driving signal. For example, when the N$^{th}$ stage ST(N) is the first stage ST located at the top, the forward start signal Vst can be applied separately as the driving signal.

The reverse drive terminal DT(Rev) can receive the scan output Gout1(N+1) applied from the subsequent stage ST as a driving signal. For example, the N$^{th}$ stage ST(N) can receive a first scan output Gout1(N+1) output from the first output terminal OUT1 of the (N+1)$^{th}$ stage ST(N+1) as a driving signal. In some embodiments, the N$^{th}$ stage ST(N) can receive a reverse start signal Vst(Rev) applied from the level shifter 130 as a driving signal. For example, when the N$^{th}$ stage ST(N) is the last stage ST located at the bottom, the reverse start signal Vst(Rve) can be applied separately as the driving signal.

Each of the first clock terminal CT1, the second clock terminal CT2 and the third clock terminal CT4 can receive one of the clock signals CLK in different phases. Specifically, there can be a difference equal to one phase between the clock signal CLK applied to the first clock terminal CT1 and the clock signal CLK applied to the second clock terminal CT2. In addition, there can be a difference equal to two phases between the clock signal CLK applied to the second clock terminal CT2 and the clock signal CLK applied to the third clock terminal CT3. For example, the first clock signal CLK1 can be applied to the first clock terminal CT1 of the N$^{th}$ stage ST(N), the second clock signal CLK2 can be applied to the second clock terminal CT2, and the fourth clock signal CLK4 can be applied to the third clock terminal CT3. The clock signal CLK input through the first clock terminal CT1 can be output to the first output terminal OUT1 as the first scan output Gout1(N) of the N$^{th}$ stage ST(N). In addition, the clock signal CLK input through the second clock terminal CT2 can be output to the second output terminal OUT2 as the second scan output Gout2(N) of the N$^{th}$ stage ST(N).

The first power terminal PT1 can receive the high-level voltage VGH, and the second power terminal PT2 can receive the low-level voltage VGL.

Each of the plurality of stages ST will be described with reference to FIG. 6. The N$^{th}$ stage ST(N) has a simple logic circuit (SLC) structure. Specifically, the N$^{th}$ stage ST(N) includes a first switching unit 610, a second switching unit 620, a third switching unit 630, a fourth switching unit 640, a fifth switching unit 650, a first output unit 660, a second output unit 670, and a stabilizing unit 680. Although the N$^{th}$ stage ST(N) shown in FIG. 6 will be described as an example, the same can be equally applied to the other stages ST.

Referring to FIG. 6, the first switching unit 610 can receive a forward driving signal Vst or a reverse driving signal Vst(Rev) to control a Q-node Q. For instance, the first switching unit 610 can be used to charge the Q-node with the high-level voltage VGH. Specifically, the first switching unit 610 includes a forward driving transistor Td and a reverse driving transistor Tdrev.

The forward driving transistor Td can be used to charge the Q-node with the high-level voltage VGH in response to the forward driving signal Vst. The gate electrode of the forward driving transistor Td can be connected to the forward driving terminal DT to receive the forward driving signal Vst. The drain electrode of the forward driving transistor Td can be connected to the first power terminal PT1 to receive the high potential voltage VGH. The source electrode of the forward driving transistor Td can be connected to the Q-node Q. As the forward driving signal Vst is applied to the gate electrode of the forward driving transistor Td, the high potential voltage VGH applied to the drain electrode can be charged at the Q-node Q connected to the source electrode.

The reverse driving transistor Tdrev can be used to charge the Q-node with the high-level voltage VGH in response to the reverse driving signal Vst(Rev). The gate electrode of the reverse driving transistor Tdrev can be connected to the reverse driving terminal DT(Rev) to receive the reverse driving signal Vst(Rev). The drain electrode of the reverse driving transistor Tdrev can be connected to the first power terminal PT1 to receive the high-level voltage VGH. The source electrode of the reverse driving transistor Td can be connected to the Q-node Q. When the reverse driving signal Vst(Rev) is applied to the gate electrode of the reverse driving transistor Tdrev, the high-level voltage VGH applied to the drain electrode can be charged at the Q-node Q connected to the source electrode.

The second switching unit 620 can receive the (N+3)$^{th}$ clock signal CLK(N+3) to control a QB-node QB. The second switching unit 620 includes a pull-down transistor Tpd.

The pull-down transistor Tpd can be used to charge the QB-node QB with the high-level voltage VGH in response to the (N+3)$^{th}$ clock signal CLK(N+3). For example, the (N+3)$^{th}$ clock signal CLK(N+3) can be the fourth clock signal CLK4. The gate electrode of the pull-down transistor Tpd can be connected to the third clock terminal CT3 to receive the (N+3)$^{th}$ clock signal CLK(N+3). The drain electrode of the pull-down transistor Tdp can be connected to the first power terminal PT1 to receive the high-level voltage VGH. The source electrode of the pull-down transistor Tpd can be connected to the QB-node QB. As the (N+3)$^{th}$ clock signal CLK(N+3) is applied to the gate electrode of the pull-down transistor Tpd, the high-level voltage VGH applied to the drain electrode can be charged at the QB-node QB connected to the source electrode.

When the Q-node Q is charged with the high-level voltage VGH, the third switching unit 630 can discharge the QB-node QB to the low-level voltage VGL. When the QB-node QB is charged with the high-level voltage VGH, the third switching unit 230 can discharge the Q-node Q to the low-level voltage VGL. The third switching unit can include a first switching transistor Ts1 and a second switching transistor Ts2.

The first switching transistor Ts1 can be used to discharge the QB-node QB to the low-level voltage VGL in response to the voltage applied to the Q-node Q. The gate electrode of the first switching transistor Ts1 can be connected to the Q-node Q to receive the voltage at the Q-node Q. When the Q-node Q is charged with the high-level voltage VGH, it can receive the high-level voltage VGH. The drain electrode of the first switching transistor Ts1 can be connected to the second power terminal PT2 to receive the low potential voltage VGL. The source electrode of the first switching transistor Ts1 can be connected to the QB-node QB. The first switching transistor Ts1 can be used to discharge the QB-node QB connected to the source electrode to the low-level voltage VGL applied to the drain electrode as the high-level voltage VGH is applied to the Q-node Q.

The second switching transistor Ts2 can be used to discharge the Q-node Q to the low-level voltage VGL in response to the voltage applied to the QB-node QB. The gate electrode of the second switching transistor Ts2 can be connected to the QB-node QB to receive the voltage at the QB-node QB. When the QB-node QB is charged with the high-level voltage VGH, it can receive the high-level voltage VGH. The drain electrode of the second switching transistor Ts2 can be connected to the second power terminal PT2 to receive the low potential voltage VGL. The source electrode of the second switching transistor Ts2 can be connected to the Q-node Q. When the high-level voltage VGH is applied to the QB-node QB, the second switching transistor Ts2 can apply the low-level voltage VGL applied to the drain electrode to the Q-node Q connected to the source electrode.

Although the stage shown in FIG. 6 includes the third switching unit 630, the third switching unit 630 can be eliminated in some implementations.

The fourth switching unit 640 can separate the first output unit 660 from the Q-node Q so that the first output unit 660 is not directly connected to the Q-node Q. The fourth switching unit 640 includes a third switching transistor Ts3.

The third switching transistor Ts3 can apply the voltage applied to the Q-node Q to the gate electrode of a first buffer transistor Tb1 of the output unit 660 in response to the high-level voltage VGH. Specifically, the gate electrode of the third switching transistor Ts3 can be connected to the first power terminal PT1 to receive the high-level voltage VGH. The drain electrode of the third switching transistor Ts3 can be connected to the Q-node Q. The source electrode of the third switching transistor Ts3 can be connected to the gate electrode of the first buffer transistor Tb1 of the first output unit 660. The third switching transistor Ts3 is always turned on by the high-level voltage VGH applied to the gate electrode and accordingly the voltage applied to the Q-node Q applied to the drain electrode can be applied to the gate electrode of the first buffer transistor Tb1.

Although the stage shown in FIG. 6 includes the fourth switching unit 640, the fourth switching unit 640 can be eliminated in some implementations. When the fourth switching unit 640 is eliminated, the gate electrode of the first buffer transistor Tb1 of the first output unit 660 can be connected to the Q-node Q.

The fifth switching unit 650 can separate the second output unit 670 from the Q-node Q so that the second output unit 670 is not directly connected to the Q-node Q. The fourth switching unit 640 includes a fourth switching transistor Ts4.

The fourth switching transistor Ts4 can apply the voltage applied to the Q-node Q to the gate electrode of a third buffer transistor Tb3 of the second output unit 670 in response to the high-level voltage VGH. Specifically, the gate electrode of the fourth switching transistor Ts4 can be connected to the first power terminal PT1 to receive the high-level voltage VGH. The drain electrode of the fourth switching transistor Ts4 can be connected to the Q-node Q. The source electrode of the fourth switching transistor Ts4 can be connected to the gate electrode of the third buffer transistor Tb3 of the second output unit 670. The fourth switching transistor Ts4 is always turned on by the high-level voltage VGH applied to the gate electrode and accordingly the voltage applied to the Q-node Q applied to the drain electrode can be applied to the gate electrode of the third buffer transistor Tb3.

Although the stage shown in FIG. 6 includes the fifth switching unit 650, the fifth switching unit 650 can be eliminated in some implementations. When the fifth switching unit 650 is eliminated, the gate electrode of the third buffer transistor Tb3 of the second output unit 670 can be connected to the Q-node Q.

The first output unit 660 can output the first scan output Gout1(N) to the first output terminal OUT1. The first output unit 660 includes a first buffer transistor Tb1 and a second buffer transistor Tb2.

The first buffer transistor Tb1 can output the first scan output Gout1(N) to the first output terminal OUT1 in response to the voltage applied to the Q-node Q. Specifically, the gate electrode of the first buffer transistor Tb1 is connected to the source electrode of the third switching transistor Ts3 of the fourth switching unit 640. The drain electrode of the first buffer transistor Tb1 is connected to the first clock terminal CT1 and receives the N$^{th}$ clock signal CLK(N). For example, the drain electrode of the first buffer transistor Tb1 can receive the first clock signal CLK1. The source electrode of the first buffer transistor Tb1 is connected to the first output terminal OUT1. The first buffer transistor Tb1 can output the N$^{th}$ clock signal CLK(N) to the first output terminal OUT1 connected to the drain electrode as the first scan output Gout1(N) from the N$^{th}$ stage ST(N) by the high-level voltage VGH applied to the source electrode of the third switching transistor Ts3 of the fourth switching unit 640. As described above, since the high potential voltage VGH is always applied to the gate electrode of the third switching transistor Ts3, the third switching transistor Ts3 is always turned on. Therefore, the voltage applied to the Q-node Q can always be applied to the gate electrode of the first buffer transistor Tb1. Accordingly, when the high-level voltage VGH is charged to the Q-node Q, the first buffer transistor Tb1 can output the $N^{th}$ clock signal CLK(N) as the first scan output (Gout1(N)) from the $N^{th}$ stage ST(N).

The second buffer transistor Tb2 can output the first scan output Gout1(N) to the first output terminal OUT1 in response to the voltage applied to the QB-node QB. Specifically, the gate electrode of the second buffer transistor Tb2 is connected to the QB-node QB. The drain electrode of the second buffer transistor Tb2 is connected to the second power terminal PT2 to receive the low-level voltage VGL. The source electrode of the second buffer transistor Tb2 is connected to the first output terminal OUT1. The second buffer transistor Tb2 can output the low-level voltage VGL as the first scan output Gout1(N) from the $N^{th}$ stage ST(N) by the voltage applied to the QB-node QB. When the high-level voltage VGH is charged at the QB-node QB, the second buffer transistor Tb2 is turned on, such that the low-level voltage VGL can be output as the first scan output Gout1(N) from the $N^{th}$ stage ST(N).

The second output unit 670 can output the second scan output Gout2(N) to the second output terminal OUT2. The second output unit 670 includes a third buffer transistor Tb3 and a fourth buffer transistor Tb4.

The third buffer transistor Tb3 can output the second scan output Gout2(N) to the second output terminal OUT2 in response to the voltage applied to the Q-node Q. Specifically, the gate electrode of the third buffer transistor Tb3 is connected to the source electrode of the fourth switching transistor Ts4 of the fifth switching unit 650. The drain electrode of the third buffer transistor Tb3 is connected to the second clock terminal CT2 and receives the $(N+1)^{th}$ clock signal CLK(N+1). For example, the drain electrode of the third buffer transistor Tb3 can receive the second clock signal CLK2. The source electrode of the third buffer transistor Tb3 is connected to the second output terminal OUT2. The third buffer transistor Tb3 can output the $(N+1)^{th}$ clock signal CLK(N+1) to the second output terminal OUT2 connected to the drain electrode as the second scan output Gout2(N) from the $N^{th}$ stage ST(N) by the high-level voltage VGH applied to the source electrode of the fourth switching transistor Ts4 of the fifth switching unit 650. As described above, since the high-level voltage VGH is always applied to the gate electrode of the fourth switching transistor Ts4, the fourth switching transistor Ts4 is always turned on. Therefore, the voltage applied to the Q-node Q can always be applied to the gate electrode of the third buffer transistor Tb3. Accordingly, when the high-level voltage VGH is charged at the Q-node Q, the third buffer transistor Tb3 can output the $(N+1)^{th}$ clock signal CLK(N+1) as the second scan output (Gout2(N)) from the $N^{th}$ stage ST(N).

The fourth buffer transistor Tb4 can output the second scan output Gout2(N) to the second output terminal OUT2 in response to the voltage applied to the QB-node QB. Specifically, the gate electrode of the fourth buffer transistor Tb4 is connected to the QB-node QB. The drain electrode of the fourth buffer transistor Tb4 is connected to the second power terminal PT2 to receive the low-level voltage VGL. The source electrode of the fourth buffer transistor Tb4 is connected to the second output terminal OUT2. The fourth buffer transistor Tb4 can output the low-level voltage VGL as the second scan output Gout2(N) from the $N^{th}$ stage ST(N) by the voltage applied to the QB-node QB. When the high-level voltage VGH is charged at the QB-node QB, the fourth buffer transistor Tb4 is turned on, such that the low-level voltage VGL can be output as the second scan output Gout2(N) from the $N^{th}$ stage ST(N).

The stabilizing unit 680 can stabilize the voltage applied to the Q-node Q and the QB-node QB. The stabilizing unit 680 includes a first capacitor C1, a second capacitor C2 and a third capacitor C3.

The first capacitor C1 is connected to the gate electrode of the first buffer transistor Tb1 of the first output unit 660 and stores a voltage applied to the Q-node Q to stabilize it. The second capacitor C2 is connected to the gate electrode of the third buffer transistor Tb3 of the second output unit 670 and stores a voltage applied to the Q-node Q to stabilize it. The third capacitor C3 can be connected to the QB-node QB to store the voltage applied to the QB-node QB, thereby stabilizing the voltage applied to the QB-node QB.

Although the stage shown in FIG. 6 includes the stabilizing unit 680, the stabilizing unit 680 can be eliminated in some implementations.

Figure 7A:
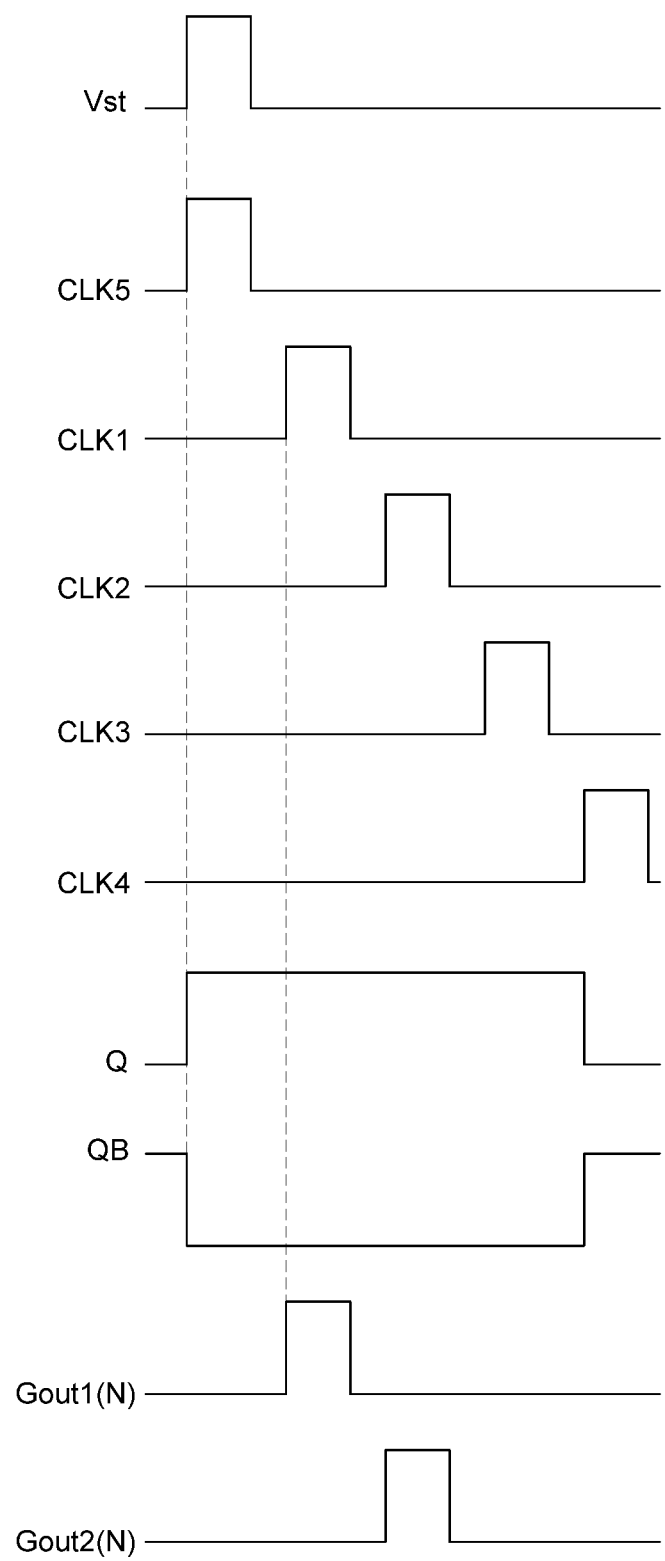
FIGS. 7A and 7B are diagrams showing waveforms of driving signals for the $N^{th}$ stage shown in FIG. 6.
Figure 7B:
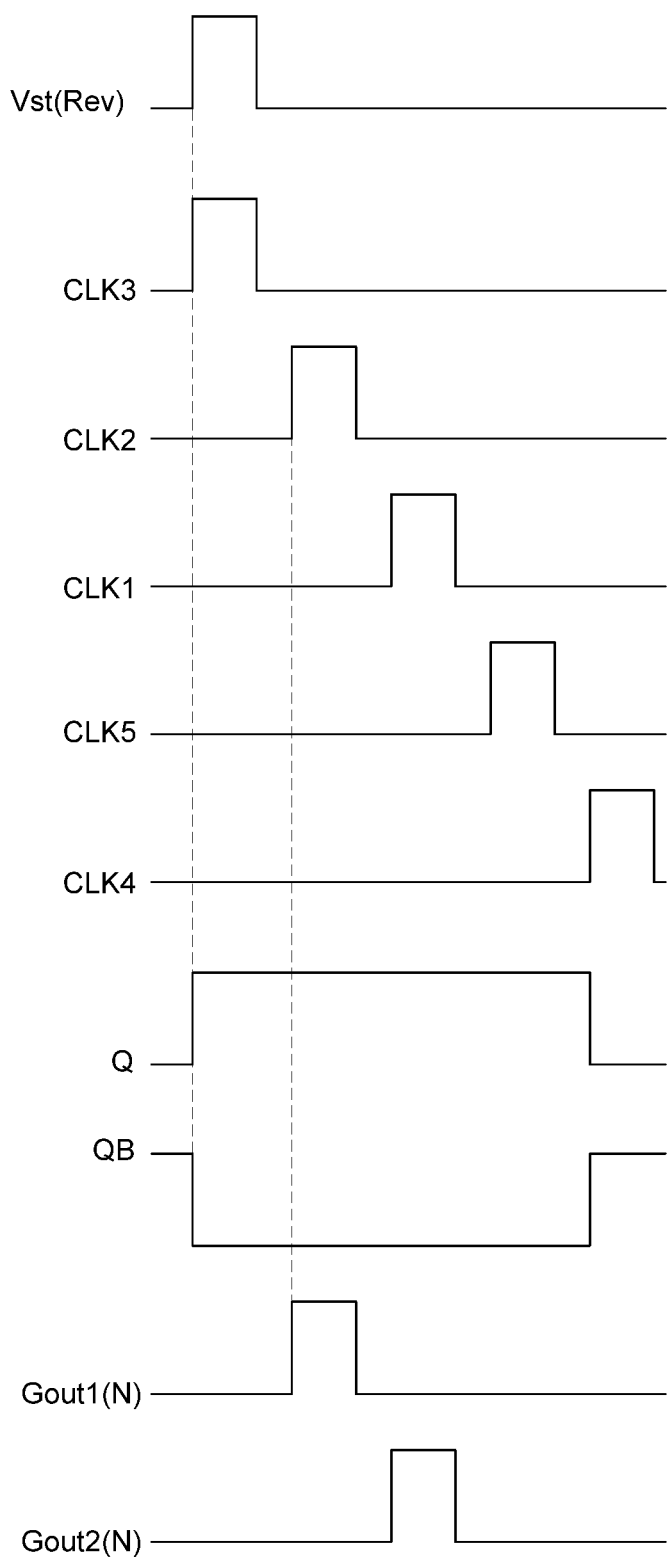

FIGS. 7A and 7B are diagrams showing waveforms of driving signals for the $N^{th}$ stage ST(N) shown in FIG. 6. FIG. 7A is a diagram showing a waveform of a driving signal when the $N^{th}$ stage ST(N) is driven in the forward direction, and FIG. 7B is a diagram showing a waveform of a driving signal when the $N^{th}$ stage ST(N) is driven in the reverse direction. The waveforms shown in FIGS. 7A and 7B are merely illustrative but are not limiting.

The forward driving will be described first with reference to FIG. 7A. The five clock signals CLK have different phases, and the first to fifth clock signals CLK1 to CLK5 sequentially have pulses at the high level. That is to say, the first clock signal CLK1, the second clock signal CLK2, the third clock signal CLK3, the fourth clock signal CLK4 and the fifth clock signal CLK5 sequentially have pulses at the high level in this order. The first clock signal CLK1 to the fifth clock signal CLK5 do not overlap with one another. It is, however, to be understood that the present disclosure is not limited thereto. Although the five clock signals CLK in different phases are used in this example embodiment, the present disclosure is not limited thereto.

Initially, when the fifth clock signal CLK5 or the forward start signal Vst is switched to the high level, the Q-node Q is charged to the high-level voltage VGH, and the QB-node QB is discharged to the low-level voltage VGL.

As described above, the second scan output Gout2(N−1) from the $(N-1)^{th}$ stage ST(N−1) or the forward start signal Vst can be applied to the forward drive terminal DT of the $N^{th}$ stage ST(N). The second scan output Gout2(N−1) from the $(N-1)^{th}$ stage ST(N−1) can be the fifth clock signal CLK5. When the fifth clock signal CLK5 or the forward start signal Vst which is switched to the high level is applied to the forward drive terminal DT of the $N^{th}$ stage ST(N), the forward driving transistor Td is turned on, and the Q-node Q can be charged with the high-level voltage VGH. As the high-level voltage VGH is applied to the Q-node Q, the first switching transistor Ts1 is turned on such that the QB-node QB is charged with the low-level voltage VGL.

As the high-level voltage VGH is applied to the Q-node Q, the first buffer transistor Tb1 of the first output unit 660 is turned on. When the first buffer transistor Tb1 is turned on, the first clock signal CLK1 is output to the first output terminal OUT1 as the first scan output Gout1(N) from the $N^{th}$ stage ST(N). In addition, as the high-level voltage VGH is applied to the Q-node Q, the third buffer transistor Tb3 of the second output unit 670 is turned on. As the third buffer transistor Tb3 is turned on, the second clock signal CLK2 is output to the second output terminal OUT2 as the second scan output Gout2(N) from the $N^{th}$ stage ST(N).

Subsequently, the first clock signal CLK1 and the second clock signal CLK2 are switched to the high level one after another. Accordingly, the first scan output Gout1(N) of the first output terminal OUT1 is output as the high-level voltage VGH, and the second scan output Gout2(N) of the second output terminal OUT2 is output as the high-level voltage VGH.

Subsequently, when the first clock signal CLK1 is switched to the high level, the first clock signal CLK1 at the high-level voltage VGH is output as the first scan output Gout1(N) from the $N^{th}$ stage ST(N). When the high-level voltage VGH is applied to the Q-node Q, the first clock signal CLK1 is output as the first scan output Gout1(N) of the $N^{th}$ stage ST(N). Thus, as the first clock signal CLK1 is switched to the high-level, the high-level voltage VGH is output to the first scan output Gout1(N) of the $N^{th}$ stage ST(N). Subsequently, when the first clock signal CLK1 is switched to the low level, the first clock signal CLK1 at the low-level voltage VGL is output as the first scan output Gout1(N) from the $N^{th}$ stage ST(N).

Subsequently, when the second clock signal CLK2 is switched to the high level, the second clock signal CLK2 at the high-level voltage VGH is output as the second scan output Gout2(N) from the $N^{th}$ stage ST(N). As the high-level voltage VGH is applied to the Q-node Q, the second clock signal CLK2 is output as the second scan output Gout2(N) of the $N^{th}$ stage ST(N). Thus, as the second clock signal CLK2 is switched to the high-level, the high-level voltage VGH is output as the second scan output Gout2(N) of the $N^{th}$ stage ST(N). Subsequently, when the second clock signal CLK2 is switched to the low level, the second clock signal CLK2 at the low-level voltage VGL is output as the second scan output Gout2(N) from the $N^{th}$ stage ST(N).

Subsequently, the fourth clock signal CLK4 is switched to the high level, the Q-node Q is discharged to the low-level voltage VGL, the QB-node QB is charged to the high-level voltage VGH, and the first scan output Gout1(N) and the second scan output Goup2(N) at the low-level voltage VGL is output from the $N^{th}$ stage ST(N).

As the fourth clock signal CLK4 is switched to the high voltage, the pull-down transistor Tpd of the second switching unit 620 is turned on. When the pull-down transistor Tpd is turned on, the high-potential voltage VGH is charged at the QB node QB.

As the high-potential voltage VGH is charged at the QB node QB, the second switching transistor Ts2 of the third switching unit 630 is turned on. As the second switching transistor Ts2 is turned on, the Q node Q is discharged to the low potential voltage VGL. When the low-level voltage VGL is applied to the Q-node Q, the first buffer transistor Tb1 of the first output unit 660 and the third buffer transistor Tb3 of the second output unit 670 are turned off.

As the high-level voltage VGH is applied to the QB-node QB, the second buffer transistor Tb2 of the first output unit 660 and the fourth buffer transistor Tb4 of the second output unit 670 are turned on. As the second buffer transistor Tb2 is turned on, the low-level voltage VGL is applied to the first output terminal OUT1, and the low-level voltage VGL is output as the first scan output Gout1(N) from the $N^{th}$ stage ST(N). In addition, as the fourth buffer transistor Tb4 is turned on, the low-level voltage VGL is applied to the second output terminal OUT2, and the low-level voltage VGL is output as the second scan output Gout2(N) from the $N^{th}$ stage ST(N).

Next, the reverse driving will be described with reference to FIG. 7B. The third clock signal CLK3, the second clock signal CLK2, the first clock signal CLK4, the fifth clock signal CLK5, and the fourth clock signal CLK4 have pulses in this order. That is to say, unlike when the forward driving signal Vst is applied as described above with respect to FIG. 7A, the fifth clock signal CLK5, the fourth clock signal CLK4, the third clock signal CLK3, the second clock signal CLK2 and the first clock signal CLK1 are switched to the high level in this order.

Initially, when the third clock signal CLK3 or the reverse start signal Vst(Rev) is switched to the high level, the Q-node Q is charged to the high-level voltage VGH, and the QB-node QB is discharged to the low-level voltage VGL.

As described above, the first scan output Gout1(N–1) from the $(N-1)^{th}$ stage ST(N–1) or the reverse start signal Vst(Rev) can be applied to the reverse drive terminal DT(Rev) of the $N^{th}$ stage ST(N). The first scan output Gout1(N–1) from the $(N-1)^{th}$ stage ST(N–1) can be the third clock signal CLK3. When the third clock signal CLK3 or the reverse start signal Vst(Rev) which is switched to the high level is applied to the reverse drive terminal DT(Rev) of the $N^{th}$ stage ST(N), the reverse driving transistor Tdrev is turned on, and the Q-node Q can be charged with the high-level voltage VGH. When the high-level voltage VGH is applied to the Q-node Q, the first switching transistor Ts1 is turned on such that the QB-node QB is charged with the low-level voltage VGL.

As the high-level voltage VGH is applied to the Q-node Q, the third buffer transistor Tb3 of the second output unit 670 is turned on. As the third buffer transistor Tb3 is turned on, the second clock signal CLK2 is output to the second output terminal OUT2 as the second scan output Gout2(N) from the $N^{th}$ stage ST(N). When the second clock signal CLK2 is switched to the high level, the high-level voltage VGH is output as the second scan output Gout2(N). When the second clock signal CLK2 is switched to the low level, the low-level voltage VGL is output as the second scan output Gout2(N).

Subsequently, the second clock signal CLK2 and the first clock signal CLK1 are switched to the high level one after another. Accordingly, the second scan output Gout2(N) of the second output terminal OUT2 is output as the high-level voltage VGH, and then the first scan output Gout1(N) of the first output terminal OUT1 is output as the high-level voltage VGH.

Specifically, when the second clock signal CLK2 is switched to the high level, the second clock signal CLK2 at the high-level voltage VGH is output as the second scan output Gout2(N) from the $N^{th}$ stage ST(N). When the high-level voltage VGH is applied to the Q-node Q, the second clock signal CLK2 is output as the second scan output Gout2(N) from the $N^{th}$ stage ST(N), and accordingly the second clock signal CLK2 is switched to the high level, such that the high-level voltage VGH is output to the second scan output Gout2(N) of the $N^{th}$ stage ST(N). Subsequently, when the second clock signal CLK2 is switched to the low level, the second clock signal CLK2 at the low-level voltage VGL is output as the second scan output Gout2(N) from the $N^{th}$ stage ST(N).

Subsequently, when the first clock signal CLK1 is switched to the high level, the first clock signal CLK1 at the high-level voltage VGH is output as the first scan output Gout1(N) from the $N^{th}$ stage ST(N). As the high-level voltage VGH is applied to the Q-node Q, the first clock signal CLK1 is output as the first scan output Gout1(N) of the $N^{th}$ stage ST(N). Thus, as the first clock signal CLK1 is switched to the high-level, the high-level voltage VGH is output to the first scan output Gout1(N) of the $N^{th}$ stage ST(N). Subsequently, when the first clock signal CLK1 is switched to the low level, the first clock signal CLK1 at the low-level voltage VGL is output as the first scan output Gout1(N) from the $N^{th}$ stage ST(N).

Subsequently, the fourth clock signal CLK4 is switched to the high level, the Q-node Q is discharged to the low-level voltage VGL, the QB-node QB is charged to the high-level voltage VGH, and the first scan output Gout1(N) and the second scan output Goup2(N) at the low-level voltage VGL is output from the $N^{th}$ stage ST(N).

As the fourth clock signal CLK4 is switched to the high voltage, the pull-down transistor Tpd of the second switching unit 620 is turned on. When the pull-down transistor Tpd is turned on, the high-potential voltage VGH is charged at the QB node QB.

As the high-potential voltage VGH is charged at the QB node QB, the second switching transistor Ts2 of the third switching unit 630 is turned on. As the second switching transistor Ts2 is turned on, the Q node Q is discharged to the low potential voltage VGL. When the low-level voltage VGL is applied to the Q-node Q, the first buffer transistor Tb1 of the first output unit 660 and the third buffer transistor Tb3 of the second output unit 670 are turned off.

As the high-level voltage VGH is applied to the QB-node QB, the second buffer transistor Tb2 of the first output unit 660 and the fourth buffer transistor Tb4 of the second output unit 670 are turned on. As the second buffer transistor Tb2 is turned on, the low-level voltage VGL is applied to the first output terminal OUT1, and the low-level voltage VGL is output as the first scan output Gout1(N) from the $N^{th}$ stage ST(N). In addition, as the fourth buffer transistor Tb4 is turned on, the low-level voltage VGL is applied to the second output terminal OUT2, and the low-level voltage VGL is output as the second scan output Gout2(N) from the $N^{th}$ stage ST(N).

In the shift register 540 according to an embodiment of the present disclosure and the display device 100 including the same, the first switching unit 610 of each of the plurality of stages ST includes the forward driving transistor Td and the reverse driving transistor Tdrev, so that the plurality of stages ST can be driven in both directions. Specifically, when the forward start signal Vst or the second scan output Gout2(N) from the previous stage ST is applied to the forward driving transistor Td, the $N^{th}$ clock signal CLK(N) can be output as the first scan output Gout1(N) from the $N^{th}$ stage ST(N). Subsequently, the $(N+1)^{th}$ clock signal CLK (N+1) can be output as the second scan output Gout2(N) of the $N^{th}$ stage ST(N). Then, the second scan output Gout2(N) from the $N^{th}$ stage ST(N) can be applied to the forward drive terminal DT of the $(N+1)^{th}$ stage ST(N+1). Therefore, the plurality of stages ST can be driven in the forward direction from the stage ST at the top to the stage ST at the bottom. In addition, when the reverse start signal Vst(Rev) or the first scan output Gout1(N) of the subsequent stage ST is applied to the reverse driving transistor Tdrev, the $(N+1)^{th}$ clock signal CLK(N+1) can be output as the second scan output Gout2(N) of the $N^{th}$ stage ST(N), and then the $N^{th}$ clock signal CLK(N) can be output as the first scan output Gout1 (N) from the $N^{th}$ stage ST(N). At this time, the first scan output Gout1(N) from the $N^{th}$ stage ST(N) can be applied to the reverse drive terminal DT(Rev) of the $(N-1)^{th}$ stage ST(N-1). Therefore, the plurality of stages ST can be driven in the reverse direction from the stage ST at the bottom to the stage ST at the top. Accordingly, the plurality of stages ST can be driven not only when the driving signal is applied to the first stage ST at the top of the shift register 540 but also when the driving signal is applied to the last stage ST at the bottom.

Incidentally, Virtual Reality (VR) is recently attracting attention, which is an environment that virtually provides a viewer with experiences/environments that she/he cannot have in the real world by way of stimulating the five senses of the human body (sight, hearing, smell, taste, touch) by using artificial technology. Virtual reality can be implemented by using various hardware and software modules, such as an input device, an output device, device driver software, and content. Typically, a VR device can include an input unit, a processing unit, and an output unit. Among them, the output unit can be implemented as a display device having increased immersion level.

A display device for displaying information is desirable for VR devices. In particular, in order to get a viewer immersed into virtual reality, the shape of the VR device is a notable factor as well as image presentation performance such as resolution. Accordingly, a head mounted display (HIVID) device is frequently used as a kind of display devices for VR devices, which is worn on a user's head. A light and thin display device is appropriate for HMD devices.

Since the VR devices, such as a HMD, is very close to the viewer's eyes, VR devices use ultra-high resolution as compared to typical display devices. As a result, the number of lines for an ultra-high-resolution display device increases, and thus the lines occupy more space and the size of the shift register also increases. In addition, as the sizes of the lines and the shift register increase, there is a problem that the size of the non-active area also increases.

In view of the above, in the shift register 540 according to another embodiment of the present disclosure and the display device 100 including the same, each of the plurality of stages ST includes the first output unit 660 and the second output unit 670, so that the area occupied by the shift register 540 in the non-active area 110B can be reduced. Specifically, each of the plurality of stages ST can output the first scan output Gout1(N) to the first output terminal OUT1 through the first output unit 660, and can output the second scan output Gout2(N) to the second output terminal OUT2 through the second output unit 670. For instance, two scan outputs Gout1 and Gout2 can be output from each of the stages ST. Each of the scan outputs Gout1 and Gout2 can be transmitted to the plurality of pixels PX through the gate lines GL connected to the output terminals OUT1 and OUT2. As each of the plurality of stages ST includes the first output unit 660 and the second output unit 670, the number of the plurality of stages ST can be reduced. As a result, the area occupied by the shift register 540 in the non-active area 110B can be reduced, and the area of the non-active area 110B can be reduced. Therefore, when the shift register 540 according to another embodiment of the present disclosure and the display device 100 including the shift register 540 are employed in a VR device, it is possible to reduce the non-active area while providing viewers with more realistic VR experience.

The example embodiments of the present disclosure can also be described as follows.

According to an aspect of the present disclosure, a shift register includes a plurality of stages. An $N^{th}$ stage among the plurality of stages includes a first switching unit for receiving a forward driving signal or a reverse driving signal, and controlling a Q-node; a second switching unit for receiving an (N+2)$^{th}$ clock signal, and controlling a QB-node; a third switching unit for discharging the QB-node to a low-level voltage if the Q-node is charged to a high-level voltage, and for discharging the Q-node to the low-level voltage if the QB-node is charged to the high-level voltage; and an output unit for outputting an N$^{th}$ clock signal to an output terminal based on a voltage at the Q-node.

The forward driving signal can be an output signal from an (N−1)$^{th}$ stage or a forward start signal, and the reverse driving signal can be an output signal from the (N+1)$^{th}$ stage or a reverse start signal.

The first switching unit can include a forward driving transistor having a gate electrode receiving the forward driving signal, a drain electrode receiving the high-level voltage, and a source electrode connected to the Q-node; and a reverse driving transistor having a gate electrode receiving the reverse driving signal, a drain electrode receiving the high-level voltage, and a source electrode connected to the Q-node.

The second switching unit can include a pull-down transistor having a gate electrode receiving the (N+2)$^{th}$ clock signal, a drain electrode receiving the high-level voltage, and a source electrode connected to the QB-node.

The third switching unit can include a first switching transistor having a gate electrode connected to the Q-node, a drain electrode receiving the low-level voltage, and a source electrode connected to the QB-node; and a second switching transistor having a gate electrode connected to the QB-node, a drain electrode receiving the low-level voltage, and a source electrode connected to the Q-node.

The shift register can further include a fourth switching unit comprising a third switching transistor having a gate electrode receiving the high-level voltage, a drain electrode connected to the Q-node, and a source electrode connected to the output unit.

The output unit can include a first buffer transistor having a gate electrode receiving the voltage at the Q-node, a drain electrode receiving the N$^{th}$ clock signal, and a source electrode connected to the output terminal; and a second buffer transistor having a gate electrode receiving the voltage at the QB-node, a drain electrode receiving the low-level voltage, and a source electrode connected to the output terminal.

The shift register can further include an abnormal operation correcting unit, in which the abnormal operation correcting unit includes a first abnormal operation transistor having a gate electrode receiving a first abnormal operation signal, a drain electrode receiving the first abnormal operation signal, and a source electrode connected to the output terminal of the output unit; and a second abnormal operation transistor having a gate electrode receiving the first abnormal operation signal, a drain electrode receiving the low-level voltage, and a source electrode connected to the QB-node.

The abnormal operation correcting unit can include a third abnormal operation transistor having a gate electrode receiving the second abnormal operation signal, a drain electrode receiving the low-level voltage, and a source electrode connected to the output terminal of the output unit.

The shift register can further include a stabilizing unit having a first capacitor connected to the Q node; and a second capacitor connected to the QB node.

According to another aspect of the present disclosure, a shift register includes a plurality of stages. An N$^{th}$ stage among the plurality of stages includes a first switching unit for receiving a forward driving signal or a reverse driving signal, and controlling a Q-node; a second switching unit for receiving an (N+3)$^{th}$ clock signal, and controlling a QB-node; a third switching unit for discharging the QB-node to a low-level voltage if the Q-node is charged to a high-level voltage, and for discharging the Q-node to the low-level voltage if the QB-node is charged to the high-level voltage; a first output unit for outputting an N$^{th}$ clock signal to a first output terminal based on a voltage at the Q-node; and a second output unit for outputting an (N+1)$^{th}$ clock signal to a second output terminal based on the voltage at the Q-node.

The forward driving signal can be an output signal from an (N−1)$^{th}$ stage or a forward start signal, and the reverse driving signal can be an output signal from the (N+1)$^{th}$ stage or a reverse start signal.

The first switching unit can include a forward driving transistor having a gate electrode receiving the forward driving signal, a drain electrode receiving the high-level voltage, and a source electrode connected to the Q-node; and a reverse driving transistor having a gate electrode receiving the reverse driving signal, a drain electrode receiving the high-level voltage, and a source electrode connected to the Q-node.

The second switching unit can include a pull-down transistor having a gate electrode receiving the (N+3)$^{th}$ clock signal, a drain electrode receiving the high-level voltage, and a source electrode connected to the QB-node.

The third switching unit can include a first switching transistor having a gate electrode connected to the Q-node, a drain electrode receiving the low-level voltage, and a source electrode connected to the QB-node; and a second switching transistor having a gate electrode connected to the QB-node, a drain electrode receiving the low-level voltage, and a source electrode connected to the Q-node.

The shift register can further include a fourth switching unit comprising a third switching transistor having a gate electrode receiving the high-level voltage, a drain electrode connected to the Q-node, and a source electrode connected to the first output unit.

The shift register can further include a fifth switching unit comprising a fourth switching transistor having a gate electrode receiving the high-level voltage, a drain electrode connected to the Q-node, and a source electrode connected to the second output unit.

The first output unit can include a first buffer transistor having a gate electrode receiving the voltage at the Q-node, a drain electrode receiving the N$^{th}$ clock signal, and a source electrode connected to the first output terminal; and a second buffer transistor having a gate electrode receiving the voltage at the QB-node, a drain electrode receiving the low-level voltage, and a source electrode connected to the first output terminal.

The shift register can further include a first capacitor connected between the gate electrode of the first buffer transistor and the first output terminal.

The second output unit can include a third buffer transistor having a gate electrode receiving the voltage at the Q-node, a drain electrode receiving the (N+1)$^{th}$ clock signal, and a source electrode connected to the second output terminal; and a fourth buffer transistor having a gate electrode connected to the QB-node, a drain electrode receiving the low-level voltage, and a source electrode connected to the second output terminal.

The shift register can further include a second capacitor connected between the gate electrode of the third buffer transistor and the second output terminal.

The shift register can further include an abnormal operation correcting unit, in which the abnormal operation correcting unit includes a first abnormal operation transistor having a gate electrode receiving an abnormal operation signal, a drain electrode receiving the abnormal operation signal, and a source electrode connected to first the output terminal of the first output unit and the second output terminal of the second output unit; and a second abnormal operation transistor having a gate electrode receiving the abnormal operation signal, a drain electrode receiving the low-level voltage, and a source electrode connected to the QB-node.

The abnormal operation correcting unit can include a third abnormal operation transistor having a gate electrode receiving the abnormal operation signal, a drain electrode receiving the low-level voltage, and a source electrode connected to the output terminal of the output unit.

According to yet another aspect of the present disclosure, there is provided a display device including the shift register.

The display device can be employed by a device for implementing a virtual reality.

Thus far, example embodiments of the present disclosure have been described in detail with reference to the accompanying drawings. However, the present disclosure is not limited to the example embodiments, and modifications and variations can be made thereto without departing from the technical idea of the present disclosure. Accordingly, the example embodiments described herein are merely illustrative and are not intended to limit the scope of the present disclosure. The technical idea of the present disclosure is not limited by the example embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. A shift register comprising:
a plurality of stages, an $N^{th}$ stage among the plurality of stages including:
a first switching unit configured to receive a forward driving signal and a reverse driving signal, and control a Q-node;
a second switching unit configured to receive an $(N+3)^{th}$ clock signal, control a QB-node, where N is a positive number;
a third switching unit configured to discharge the QB-node to a low-level voltage when the Q-node is charged to a high-level voltage, and discharge the Q-node to the low-level voltage when the QB-node is charged to the high-level voltage;
a first output unit configured to output an $N^{th}$ clock signal to a first output terminal based on a voltage at the Q-node; and
a second output unit configured to output an $(N+1)^{th}$ clock signal to a second output terminal based on the voltage at the Q-node.

2. The shift register of claim 1, wherein the forward driving signal is an output signal from an $(N-1)^{th}$ stage among the plurality of stages or a forward start signal from an external source external to the shift register, and
wherein the reverse driving signal is an output signal from the $(N+1)^{th}$ stage among the plurality of stages or a reverse start signal from the external source.

3. The shift register of claim 1, wherein the first switching unit comprises:
a forward driving transistor having a gate electrode configured to receive the forward driving signal, a drain electrode configured to receive the high-level voltage, and a source electrode connected to the Q-node; and a reverse driving transistor having a gate electrode configured to receive the reverse driving signal, a drain electrode configured to receive the high-level voltage, and a source electrode connected to the Q-node, and
wherein the second switching unit comprises:
a pull-down transistor having a gate electrode configured to receive the $(N+3)^{th}$ clock signal, a drain electrode configured to receive the high-level voltage, and a source electrode connected to the QB-node.

4. The shift register of claim 1, wherein the third switching unit comprises:
a first switching transistor having a gate electrode connected to the Q-node, a drain electrode configured to receive the low-level voltage, and a source electrode connected to the QB-node; and
a second switching transistor having a gate electrode connected to the QB-node, a drain electrode configured to receive the low-level voltage, and a source electrode connected to the Q-node.

5. The shift register of claim 2, further comprising:
a fourth switching unit comprising a third switching transistor having a gate electrode configured to receive the high-level voltage, a drain electrode connected to the Q-node, and a source electrode connected to the first output unit.

6. The shift register of claim 2, wherein the first output unit comprises:
a first buffer transistor having a gate electrode configured to receive the voltage at the Q-node, a drain electrode configured to receive the $N^{th}$ clock signal, and a source electrode connected to the first output terminal; and
a second buffer transistor having a gate electrode connected to the QB-node, a drain electrode configured to receive the low-level voltage, and a source electrode connected to the first output terminal.

7. The shift register of claim 2, wherein the second output unit comprises:
a third buffer transistor having a gate electrode configured to receive the voltage at the Q-node, a drain electrode configured to receive the $(N+1)^{th}$ clock signal, and a source electrode connected to the second output terminal; and
a fourth buffer transistor having a gate electrode connected to the QB-node, a drain electrode configured to receive the low-level voltage, and a source electrode connected to the second output terminal.

8. The shift register of claim 7, further comprising:
a second capacitor connected between the gate electrode of the third buffer transistor and the second output terminal.

9. The shift register of claim 2, further comprising:
an abnormal operation correcting unit including:
a first abnormal operation transistor having a gate electrode configured to receive an abnormal operation signal, a drain electrode configured to receive the abnormal operation signal, and a source electrode connected to the first output terminal of the first output unit and the second output terminal of the second output unit; and
a second abnormal operation transistor having a gate electrode configured to receive the abnormal operation signal, a drain electrode configured to receive the low-level voltage, and a source electrode connected to the QB-node.

10. The shift register of claim 9, wherein the abnormal operation correcting unit further includes:

a third abnormal operation transistor having a gate electrode configured to receive the abnormal operation signal, a drain electrode configured to receive the low-level voltage, and a source electrode connected to the output terminal of the first output unit and the second output terminal of the second output unit.

* * * * *